(12) United States Patent
Kondo et al.

(10) Patent No.: US 9,886,199 B2
(45) Date of Patent: Feb. 6, 2018

(54) MAGNETIC MEMORY DEVICE AND MAGNETIC STORAGE METHOD

(71) Applicant: KABUSHIKI KAISHA TOSHIBA, Tokyo (JP)

(72) Inventors: Tsuyoshi Kondo, Kanagawa (JP); Hirofumi Morise, Kanagawa (JP); Yasuaki Ootera, Kanagawa (JP); Takuya Shimada, Kanagawa (JP); Michael Arnaud Quinsat, Kanagawa (JP); Yoshiaki Osada, Kanagawa (JP); Yoshihisa Iwata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 15/007,794

(22) Filed: Jan. 27, 2016

(65) Prior Publication Data

US 2016/0224242 A1 Aug. 4, 2016

(30) Foreign Application Priority Data

Jan. 30, 2015 (JP) ................... 2015-017660

(51) Int. Cl.
*G06F 3/06* (2006.01)
*G11C 11/16* (2006.01)
*G11C 19/02* (2006.01)
*G11C 19/08* (2006.01)

(52) U.S. Cl.
CPC ............ *G06F 3/061* (2013.01); *G06F 3/0655* (2013.01); *G06F 3/0683* (2013.01); *G11C 11/161* (2013.01); *G11C 11/1659* (2013.01); *G11C 11/1673* (2013.01); *G11C 11/1675* (2013.01);

(Continued)

(58) Field of Classification Search
CPC ...... G06F 3/061; G06F 3/0655; G06F 3/0683; G11C 19/02; G11C 19/0808
See application file for complete search history.

(56) References Cited

U.S. PATENT DOCUMENTS

| 8,374,052 B2 * | 2/2013 | Kim ................ G11C 11/14 365/158 |
| 8,537,588 B2 | 9/2013 | De Brosse et al. |
| 9,123,878 B2 | 9/2015 | Iwata et al. |

(Continued)

FOREIGN PATENT DOCUMENTS

| GB | 2 438 003 A | 11/2007 |
| JP | 2009-536420 | 10/2009 |

*Primary Examiner* — Reginald Bragdon
*Assistant Examiner* — Edward Wang
(74) *Attorney, Agent, or Firm* — Finnegan, Henderson, Farabow, Garrett & Dunner, L.L.P.

(57) ABSTRACT

According to one embodiment, a magnetic memory device includes a first memory unit including a first memory array and a first drive unit, a second memory unit including a second memory array and a second drive unit, and a controller. The first memory array includes a first magnetic shift register unit. The second memory array includes a second magnetic shift register unit. The controller subdivides input data into a plurality of one-dimensional bit input arrays. The one-dimensional bit input arrays include a first array and a second array. The controller stores the first array in the first magnetic shift register unit on a last in, first out basis, and stores the second array in the second magnetic shift register unit on a last in, first out basis.

14 Claims, 14 Drawing Sheets

(52) U.S. Cl.
CPC .......... *G11C 19/02* (2013.01); *G11C 19/0808* (2013.01)

(56) References Cited

U.S. PATENT DOCUMENTS

| | | | |
|---|---|---|---|
| 2007/0262301 A1 | 11/2007 | Cowburn et al. | |
| 2010/0002486 A1* | 1/2010 | DeBrosse | G11C 11/14 365/80 |
| 2010/0110747 A1* | 5/2010 | Nakaoka | G11C 11/4076 365/51 |
| 2010/0128510 A1* | 5/2010 | Cowburn | B82Y 10/00 365/80 |

* cited by examiner

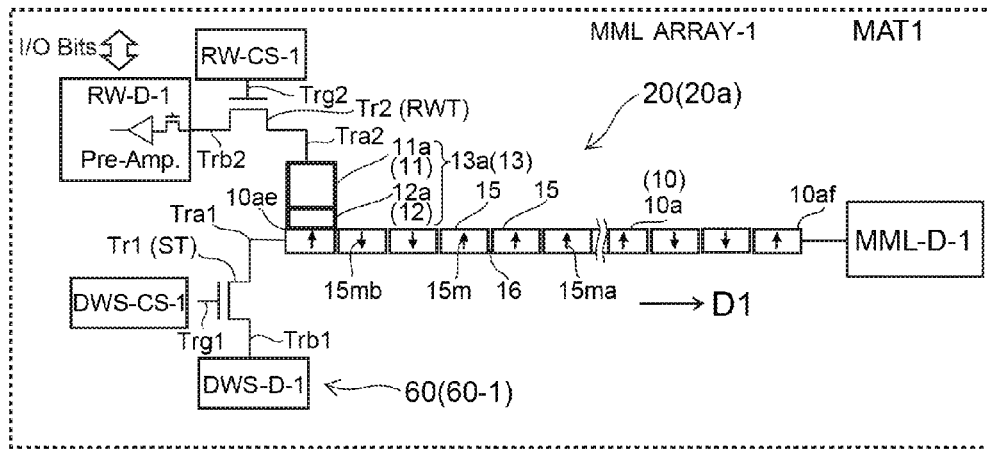
FIG. 4A
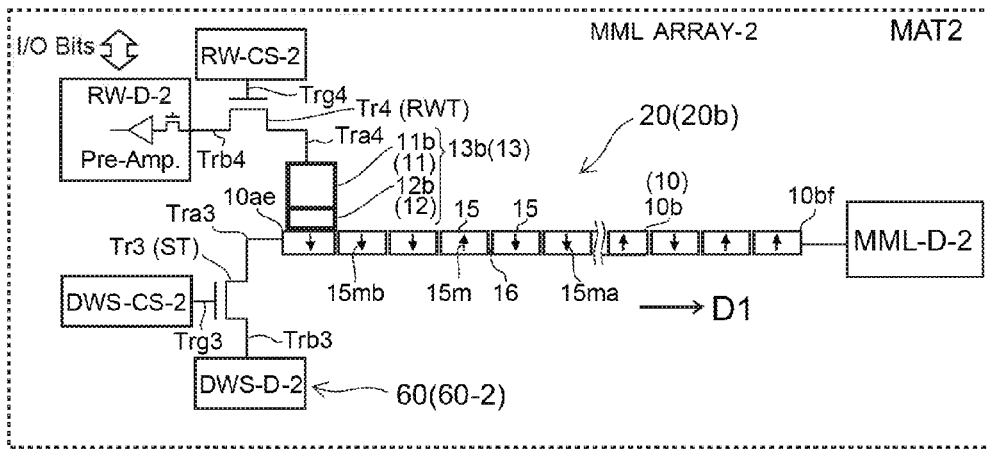
FIG. 4B
FIG. 5A  WO  
FIG. 5B  RO  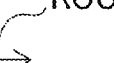

MAGNETIC MEMORY DEVICE AND MAGNETIC STORAGE METHOD

CROSS-REFERENCE TO RELATED APPLICATIONS

This application is based upon and claims the benefit of priority from Japanese Patent Application No. 2015-017660, filed on Jan. 30, 2015; the entire contents of which are incorporated herein by reference.

FIELD

Embodiments described herein relate generally to a magnetic memory device and a magnetic storage method.

BACKGROUND

A magnetic memory device that uses magnetic wires has been proposed. It is desirable to simultaneously realize high density memory and a practical input/output speed.

BRIEF DESCRIPTION OF THE DRAWINGS

FIG. 4A and FIG. 4B are schematic views showing the magnetic memory device according to the first embodiment;

FIG. 5A and FIG. 5B are schematic views showing operations of the magnetic memory device according to the first embodiment;

DETAILED DESCRIPTION

Figure 1:
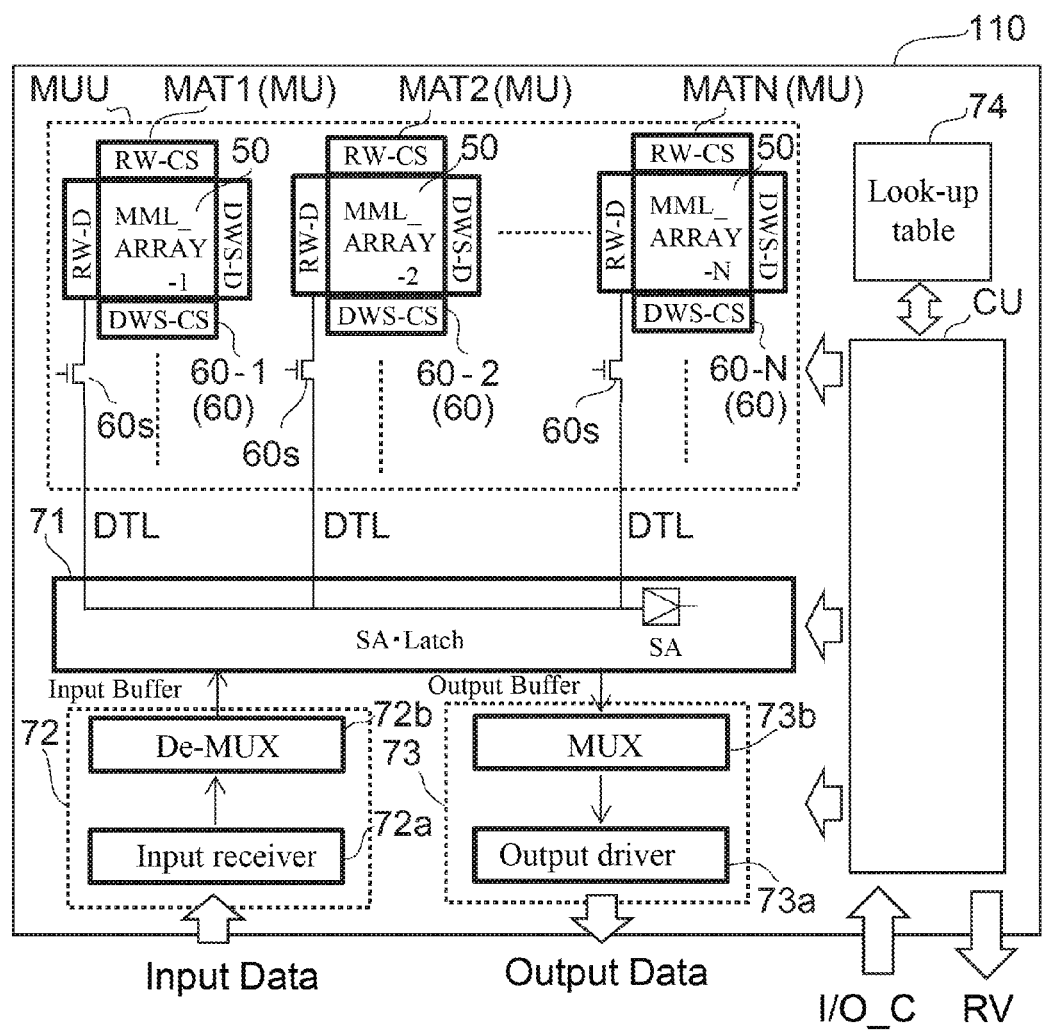
FIG. 1 is a schematic view showing a magnetic memory device according to a first embodiment.

According to one embodiment, a magnetic memory device includes a first memory unit including a first memory array and a first drive unit, a second memory unit including a second memory array and a second drive unit, and a controller. The first memory array includes a first magnetic shift register unit. The second memory array includes a second magnetic shift register unit. The controller subdivides input data into a plurality of one-dimensional bit input arrays. The one-dimensional bit input arrays include a first array and a second array. The controller stores the first array in the first magnetic shift register unit on a last in, first out basis, and stores the second array in the second magnetic shift register unit on a last in, first out basis.

According to another embodiment, a magnetic storage method is disclosed. The method can include subdividing input data into a plurality of one-dimensional bit input arrays including a first array and a second array. The method can include storing the first array in a first magnetic shift register unit on a last in, first out basis, and storing the second array in a second magnetic shift register unit on a last in, first out basis. The first magnetic shift register unit is included in a first memory array. The second magnetic shift register unit is included in a second memory array. The first memory array is included in a first memory unit, the first memory unit including a first drive unit. The second memory array is included in a second memory unit, the second memory unit including a second drive unit.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a schematic view illustrating a magnetic memory device according to a first embodiment.

As shown in FIG. 1, the magnetic memory device 110 according to the embodiment includes multiple memory units MU and a controller CU. In the example, a sense latch unit 71, an input buffer 72, an output buffer 73, and a lookup table 74 are further provided in the magnetic memory device 110. These components may be considered to be included in the controller CU.

The multiple memory units MU are included in a memory region unit MUU. In the embodiment, multiple memory region units MUU may be provided in the magnetic memory device 110.

For example, the multiple memory units MU include a first memory unit MAT1, a second memory unit MAT2, etc.

The multiple memory units MU include an Nth memory unit MATN, where the number of memory units MU is N (N being 2 or more).

Each of the multiple memory units MU includes a memory array 50 and a drive unit 60. The memory arrays 50 are, for example, a first memory array MML_ARRAY-1, a second memory array MML_ARRAY-2, an Nth memory array MML_ARRAY-N, etc. The drive units 60 are, for example, a first drive unit 60-1, a second drive unit 60-2, an Nth drive unit 60-N, etc.

One drive unit 60 includes, for example, a shift driver DWS-D, a shift selector DWS-CS, a read/write driver RW-D, and a read/write selector RW-CS. These components are described below.

For example, the first memory unit MAT1 includes the first memory array MML_ARRAY-1 and the first drive unit 60-1. For example, the second memory unit MAT2 includes the second memory array MML_ARRAY-2 and the second drive unit 60-2. For example, the Nth memory unit MATN includes the Nth memory array MML_ARRAY-N and the Nth drive unit 60-N.

Examples of the memory array 50 and the drive unit 60 are described below.

One end of a data transfer line DTL is connected to the drive unit 60 for each of the multiple drive units 60. A selection switch 60s is provided on the path of the data transfer line DTL as necessary. The other ends of the data transfer lines DTL are connected to the sense latch unit 71. The sense latch unit 71 includes a sense amplifier SA. The sense amplifier SA is connected to the multiple data transfer lines DTL. For example, the sense latch unit 71 further includes a latch circuit.

The input buffer 72 includes an input unit 72a and a demultiplexer 72b. The input data of the magnetic memory device 110 (the data to be stored) is input to the input unit 72a. The output of the input unit 72a is supplied to the demultiplexer 72b. The output of the demultiplexer 72b is supplied to the sense latch unit 71. Based on the output of the demultiplexer 72b, the output of the sense latch unit 71 is supplied to the drive units 60 via the data transfer lines DTL.

The output buffer 73 includes a multiplexer 73b and an output unit 73a. The output of the sense latch unit 71 (the output of the sense amplifier SA) is supplied to the multiplexer 73b. The output of the multiplexer 73b is supplied to the output unit 73a. The output of the output unit 73a is used as the output data of the magnetic memory device 110. The output data corresponds to the data that was stored.

An input/output command I/O_C is input to the controller CU. Based on the input/output command I/O_C, the controller CU controls the memory region unit MUU, the sense latch unit 71, the input buffer 72, and the output buffer 73. A lookup table 74 is used when performing this control. A return value RV that corresponds to the operation of the controller CU is output from the controller CU.

Figure 2A:
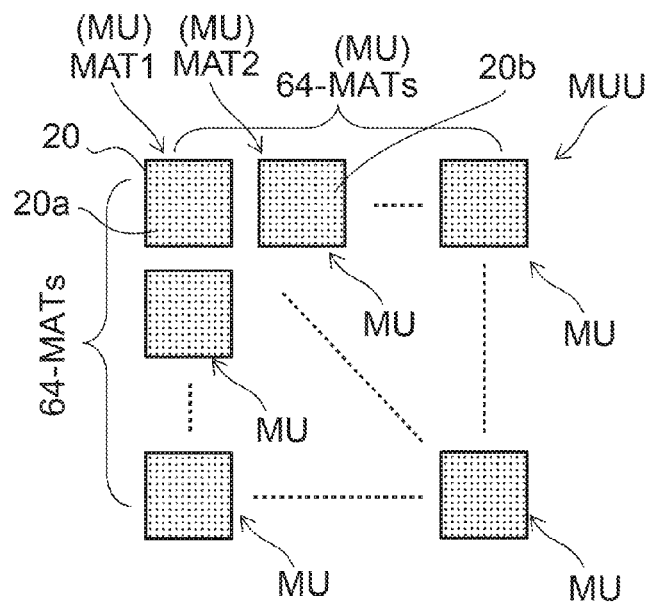
FIG. 2A and FIG. 2B are schematic views showing the magnetic memory device according to the first embodiment.
Figure 2B:
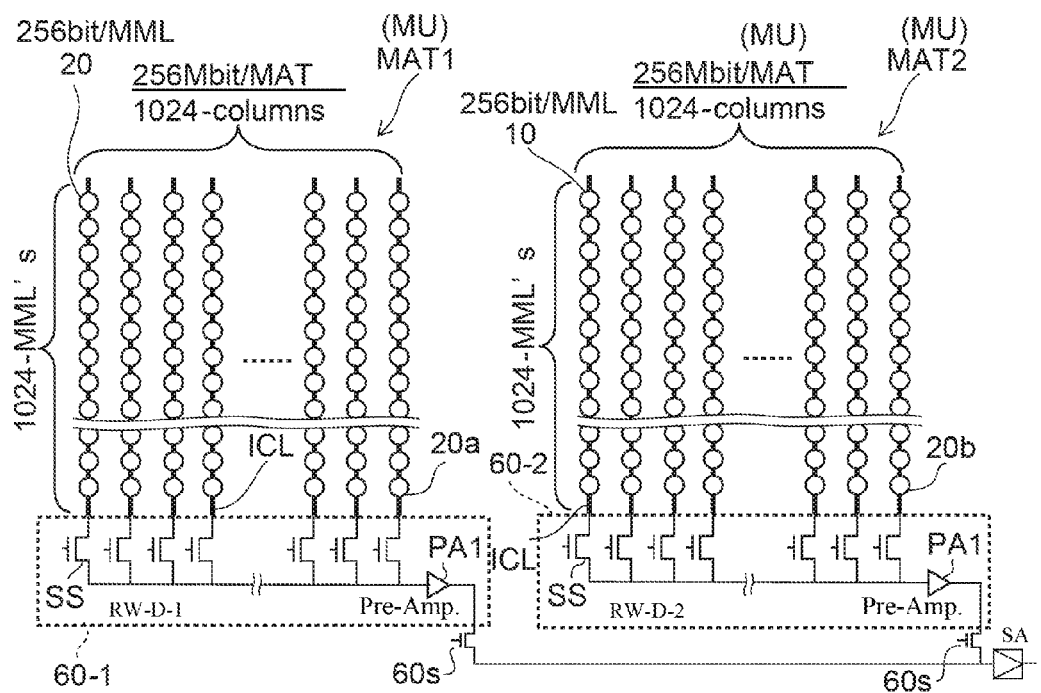

FIG. 2A and FIG. 2B are schematic views illustrating the magnetic memory device according to the first embodiment.

As illustrated in FIG. 2A, multiple memory units MU are provided in the memory region unit MUU. For example, the multiple memory units MU are arranged in a matrix configuration. In the memory region unit MUU, the number of memory units MU arranged along the row direction is, for example, 64. The number of memory units MU arranged along the column direction is, for example, 64. In such a case, the number of memory units MU provided in one memory region unit MUU is 4096 (i.e., 64×64). The first memory unit MAT1, the second memory unit MAT2, etc., are provided in the memory region unit MUU.

FIG. 2B is an enlarged illustration of the first memory unit MAT1 and the second memory unit MAT2. Multiple magnetic shift register units 20 are provided in the first memory unit MAT1 and in the second memory unit MAT2. Each of the multiple magnetic shift register units 20 includes a magnetic shift register MML (a magnetic wire) described below. For example, the multiple magnetic shift register units 20 are arranged in a matrix configuration. For example, the first memory unit MAT1 includes a first magnetic shift register unit 20a. For example, the second memory unit MAT2 includes a second magnetic shift register unit 20b.

In the first memory unit MAT1, the number of magnetic shift register units 20 arranged in the row direction is, for example, 1024. The number of magnetic shift register units 20 arranged in the row direction is, for example, 1024. In such a case, the number of magnetic shift register units 20 provided in one memory unit MU (e.g., the first memory unit MAT1) is 1 M (i.e., 1024×1024).

1024×1024 magnetic shift register units 20 are provided in the second memory unit MAT2 as well. The number of magnetic shift register units 20 provided in the second memory unit MAT2 is, for example, 1 M.

The capacity of one magnetic shift register unit 20 (the magnetic shift register MML) is, for example, 256 bits. In such a case, the capacity of one memory unit MU (the first memory unit MAT1, the second memory unit MAT2, or the like) is 256 M bits.

Accordingly, in the case of the example recited above, the capacity of one memory region unit MUU is 4096×256 M bits (i.e., 1 terabit).

As illustrated in FIG. 2B, a first read/write driver RW-D-1 is provided in the first drive unit 60-1 of the first memory unit MAT1. A first preamplifier PA1 is provided in the first read/write driver RW-D-1. The multiple magnetic shift register units 20 that are included in the first memory unit MAT1 are connected by interconnects ICL. The interconnects ICL are connected to the first preamplifier PA1 via selection switches SS. The output of the first preamplifier PA1 is input to the sense amplifier SA via the selection switch 60s.

Similarly, a second read/write driver RW-D-2 is provided in the second drive unit 60-2 of the second memory unit MAT2. A second preamplifier PA2 is provided in the second read/write driver RW-D-2. The interconnects ICL that are connected to the multiple magnetic shift register units 20 of the second memory unit MAT2 are connected to the second preamplifier PA2 via the selection switches SS. The output of the second preamplifier PA2 is input to the sense amplifier SA via the selection switch 60s.

Figure 3:
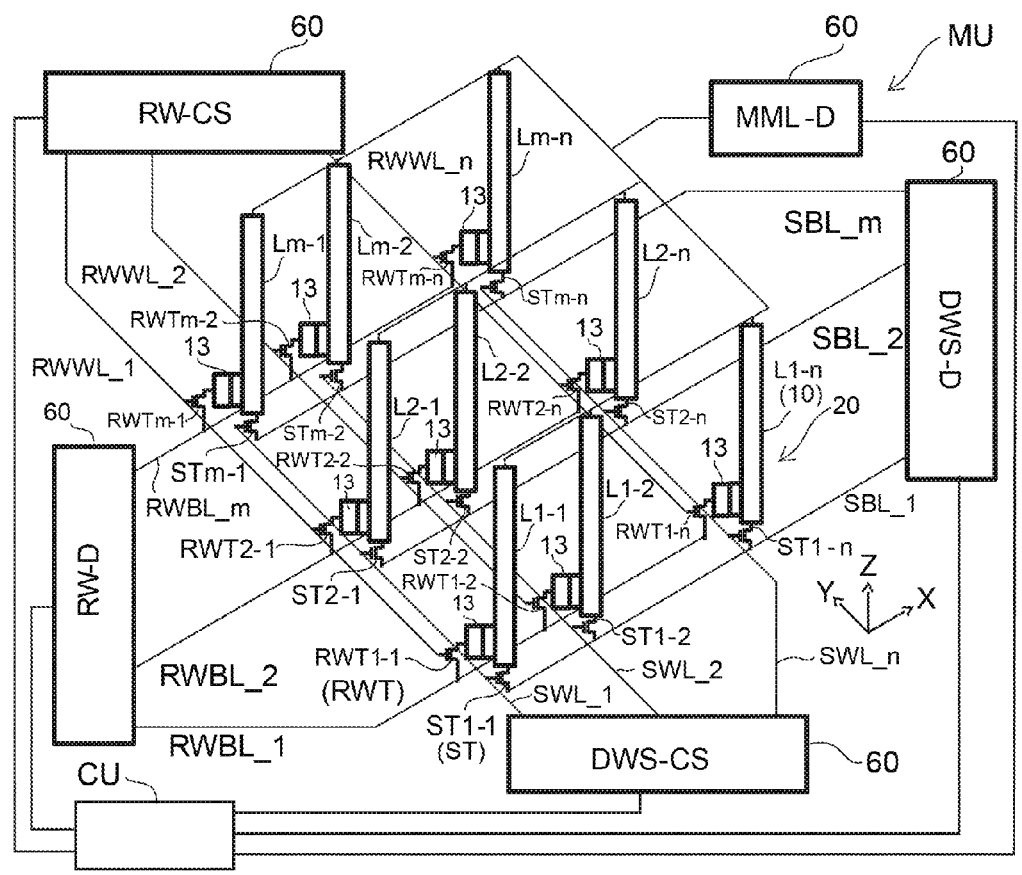
FIG. 3 is a schematic view showing the magnetic memory device according to the first embodiment.

FIG. 3 is a schematic view illustrating the magnetic memory device according to the first embodiment.

FIG. 3 illustrates one memory unit MU.

The memory unit MU includes the multiple magnetic shift register units 20. The magnetic shift register units 20 include magnetic wires 10. n (n being an integer not less than 2) is the number of magnetic shift register units 20 arranged in an X-axis direction. m (m being an integer not less than 2) is the number of magnetic shift register units 20 arranged in a Y-axis direction. The Y-axis direction intersects (e.g., is orthogonal to) the X-axis direction. A direction intersecting (e.g., orthogonal to) the X-axis direction and the Y-axis direction is taken as a Z-axis direction. For example, the magnetic shift registers MML of the multiple magnetic shift register units 20 extend along the Z-axis direction.

For example, the multiple magnetic shift register units 20 respectively include the multiple magnetic wires 10 (e.g., the magnetic wires L1-1, L1-2, L1-*n*, L2-1, L2-2, L2-*n*, Lm-1, Lm-2, Lm-n, etc.). The magnetic wire 10 corresponds to the magnetic shift register MML.

One end of each of transistors ST (ST1-1, ST1-2, ST1-*n*, ST2-1, ST2-2, ST2-*n*, STm-1, STm-2, and STm-n) for shifting is connected to one end of each of the magnetic wires L1-1, L1-2, L1-*n*, L2-1, L2-2, L2-*n*, Lm-1, Lm-2, and Lm-n. The gates of the transistors ST for shifting are connected to the shift selector DWS-CS (e.g., a Domain Wall Shift Column Selector). Interconnects SWL_1, SWL_2, and SWL_n are used for these connections. The other ends of the transistors ST for shifting are connected to the shift driver DWS-D (e.g., a Domain Wall Shift Driver). Interconnects SBL_1, SBL_2, and SBL_m are used for these connections.

Input/output units 13 are provided respectively for the magnetic wires L1-1, L1-2, L1-*n*, L2-1, L2-2, L2-*n*, Lm-1, Lm-2, and Lm-n. One end of each of transistors RWT (RWT1-1, RWT1-2, RWT1-*n*, RWT2-1, RWT2-2, RWT2-*n*, RWTm-1, RWTm-2, and RWTm-n) for input/output is connected to each of the input/output unit 13. The gates of the transistors RWT for input/output are connected to the read/write selector RW-CS. Interconnects RWWL_1, RWWL_2, and RWWL_n are used for these connections. The other ends of the transistors RWT for input/output are connected to the read/write driver RW-D. Interconnects RWBL_1, RWBL_2, and RWBL_m are used for these connections.

In the example, the other ends of the magnetic wires L1-1, L1-2, L1-*n*, L2-1, L2-2, L2-*n*, Lm-1, Lm-2, and Lm-n are connected to a magnetic wire driver MML-D.

The shift driver DWS-D, the shift selector DWS-CS, the read/write driver RW-D, the read/write selector RW-CS, and the magnetic wire driver MML-D are controlled by being connected to the controller CU.

FIG. 4A and FIG. 4B are schematic views illustrating the magnetic memory device according to the first embodiment.

These drawings illustrate one magnetic shift register unit 20 included in the first memory unit MAT1 or the second memory unit MAT2.

As shown in FIG. 4A, the memory array 50 (the first memory array MML_ARRAY-1) that is included in the first memory unit MAT1 includes the first magnetic shift register unit 20*a*.

The first magnetic shift register unit 20*a* includes a first transistor Tr1, a second transistor Tr2, the magnetic wire 10 (a first magnetic wire 10*a*), a magnetic layer 11 (a first magnetic layer 11*a*), and an intermediate layer 12 (a first intermediate layer 12*a*). The magnetic layer 11 (the first magnetic layer 11*a*) and the intermediate layer 12 (the first intermediate layer 12*a*) are included in the input/output unit 13 (a first input/output unit 13*a*).

The first transistor Tr1 is the transistor ST for shifting. The first transistor Tr1 includes a first terminal Tra1, a second terminal Trb1, and a first gate Trg1. The first terminal Tra1 is, for example, one of a source or a drain. The second terminal Trb1 is the other of the source or the drain.

The second transistor Tr2 is the transistor RWT for input/output. The second transistor Tr2 includes a third terminal Tra2, a fourth terminal Trb2, and a second gate Trg2. The third terminal Tra2 is, for example, one of a source or a drain. The fourth terminal Trb2 is the other of the source or the drain.

The magnetic wire 10 (the first magnetic wire 10*a*) includes multiple magnetic domains 15. Domain walls 16 are provided in the first magnetic wire 10*a*. The domain walls 16 are provided between the multiple magnetic domains 15 and divide the multiple magnetic domains 15. The first magnetic wire 10*a* includes a first end portion 10*ae* and a first other end portion 10*af*. The first end portion 10*ae* is connected to the first terminal Tra1 of the first transistor Tr1.

The intermediate layer 12 (the first intermediate layer 12*a*) is provided between the magnetic layer 11 (the first magnetic layer 11*a*) and the magnetic wire 10 (the first magnetic wire 10*a*). The first magnetic layer 11*a* is electrically connected to the third terminal Tra2 of the second transistor Tr2.

The first drive unit 60-1 includes a first shift driver DWS-D-1, a first shift selector DWS-CS-1, the first read/write driver RW-D-1, and a first read/write selector RW-CS-1.

The first shift driver DWS-D-1 is electrically connected to the second terminal Trb1 of the first transistor Tr1.

The first shift selector DWS-CS-1 is electrically connected to the first gate Trg1 of the first transistor Tr1.

The first read/write driver RW-D-1 is electrically connected to the fourth terminal Trb2 of the second transistor Tr2.

The first read/write selector RW-CS-1 is electrically connected to the second gate Trg2 of the second transistor Tr2.

In the example, the first drive unit 60-1 further includes a first magnetic wire driver MML-D-1. The first magnetic wire driver MML-D-1 is connected to the first other end portion 10*af* of the first magnetic wire 10*a*.

As shown in FIG. 4B, the second memory array MML_ARRAY-2 that is included in the second memory unit MAT2 includes the second magnetic shift register unit 20*b*.

The second magnetic shift register unit 20*b* includes a third transistor Tr3, a fourth transistor Tr4, a second magnetic wire 10*b*, a second magnetic layer 11*b*, and a second intermediate layer 12*b*. The second magnetic layer 11*b* and the second intermediate layer 12*b* are included in a second input/output unit 13*b*.

The third transistor Tr3 is the transistor ST for shifting. The third transistor Tr3 includes a fifth terminal Tra3, a sixth terminal Trb3, and a third gate Trg3. The fifth terminal Tra3 is, for example, one of a source or a drain. The sixth terminal Trb3 is the other of the source or the drain.

The fourth transistor Tr4 is the transistor RWT for input/output. The fourth transistor Tr4 includes a seventh terminal Tra4, an eighth terminal Trb4, and a fourth gate Trg4. The seventh terminal Tra4 is, for example, one of a source or a drain. The eighth terminal Trb4 is the other of the source or the drain.

The second magnetic wire 10*b* includes the multiple magnetic domains 15. The domain walls 16 are provided in the second magnetic wire 10*b*. The second magnetic wire 10*b* includes a second end portion 10*be* and a second other end portion 10*bf*. The second end portion 10*be* is connected to the fifth terminal Tra3 of the third transistor Tr3.

The second intermediate layer 12*b* is provided between the second magnetic layer 11*b* and the second magnetic wire 10*b*. The second magnetic layer 11*b* is electrically connected to the seventh terminal Tra4 of the fourth transistor Tr4.

The second drive unit 60-2 includes a second shift driver DWS-D-2, a second shift selector DWS-CS-2, the second read/write driver RW-D-2, and a second read/write selector RW-CS-2.

The second shift driver DWS-D-2 is electrically connected to the sixth terminal Trb3 of the third transistor Tr3.

The second shift selector DWS-CS-2 is electrically connected to the third gate Trg3 of the third transistor Tr3.

The second read/write driver RW-D-2 is electrically connected to the eighth terminal Trb4 of the fourth transistor Tr4.

The second read/write selector RW-CS-2 is electrically connected to the fourth gate Trg4 of the fourth transistor Tr4.

In the example, the second drive unit 60-2 further includes a second magnetic wire driver MML-D-2. The second magnetic wire driver MML-D-2 is connected to the second other end portion 10bf of the second magnetic wire 10b.

In the example shown in FIG. 4A, the intermediate layer 12 (the first intermediate layer 12a) is provided between the first end portion 10ae and the magnetic layer 11 (the first magnetic layer 11a). In the example shown in FIG. 4B, the second intermediate layer 12b is provided between the second end portion 10be and the second magnetic layer 11b.

At least one portion of the magnetic wire 10 (the first magnetic wire 10a) extends in a first direction D1. Magnetizations 15m of the magnetic domains 15 included in the at least one portion of the magnetic wire 10 (the first magnetic wire 10a) recited above are in a first magnetization direction 15ma in one state (a first state). The first magnetization direction 15ma intersects the first direction D1. The magnetizations 15m of the magnetic domains 15 included in the at least one portion of the magnetic wire 10 (the first magnetic wire 10a) recited above are in a second magnetization direction 15mb in one other state (a second state). The second magnetization direction 15mb intersects the first direction D1 and is the reverse of the first magnetization direction 15ma.

At least one portion of the second magnetic wire 10b extends in the first direction D1. The magnetizations 15m of the magnetic domains 15 included in the at least one portion of the second magnetic wire 10b recited above are in the first magnetization direction 15ma in the first state. The magnetizations 15m of the magnetic domains 15 included in the at least one portion of the second magnetic wire 10b recited above are in the second magnetization direction 15mb in the second state.

The first direction D1 recited above is, for example, the Z-axis direction.

The magnetizations 15m of the multiple magnetic domains 15 of the magnetic wire 10 are controlled by a signal supplied to the input/output unit 13. Thereby, the first magnetization direction 15ma and the second magnetization direction 15mb recited above are formed. The directions of the magnetizations 15m of the multiple magnetic domains 15 inside the magnetic wire 10 (the first magnetization direction 15ma and the second magnetization direction 15mb) correspond to the information to be stored.

For example, the magnetizations 15m of the multiple magnetic domains 15 are shifted by a current flowing in the magnetic wire 10. For example, the magnetizations 15m move from the first end portion 10ae toward the first other end portion 10af when a current flows in the first magnetic wire 10a from the first end portion 10ae toward the first other end portion 10af. For example, the magnetizations 15m move from the first other end portion 10af toward the first end portion 10ae when a current flows in the first magnetic wire 10a from the first other end portion 10af toward the first end portion 10ae. The orientation of the current may be the reverse of the orientation of the shift of the magnetizations 15m.

For example, when storing (writing) information in the first magnetic wire 10a, a current pulse from the first end portion 10ae toward the first other end portion 10af is supplied to the first magnetic wire 10a; and the first magnetization direction 15ma or the second magnetization direction 15mb is formed in the first magnetic wire 10a by the first input/output unit 13a. The magnetization directions of the first magnetic wire 10a are shifted by the current pulse.

For example, when reproducing (reading) the information stored in the first magnetic wire 10a, the current pulse from the first other end portion 10af toward the first end portion 10ae is supplied to the first magnetic wire 10a; and the direction (the first magnetization direction 15ma or the second magnetization direction 15mb) of the magnetization 15m of the first magnetic wire 10a is read by the first input/output unit 13a. For example, the magnetization 15m is sensed at the first input/output unit 13a using a magnetoresistance effect, etc.

Thus, the writing and reading of the information to and from the first magnetic shift register unit 20a (the first magnetic wire 10a, i.e., the magnetic shift register MML) is performed on a last in, first out (LIFO) basis. Similarly, the writing and reading of the information to and from the second magnetic shift register unit 20b (the second magnetic wire 10b, i.e., the magnetic shift register MML) is performed on a last in, first out basis. Last in, first out corresponds to first in, last out (FILO).

FIG. 5A and FIG. 5B are schematic views illustrating operations of the magnetic memory device according to the first embodiment.

In a writing operation WO as shown in FIG. 5A, for example, an order WOO of the write bits is in the direction of the arrow inside FIG. 5A in the case where the information to be written is "0110011101, . . . , 0001."

FIG. 5B shows the state when reading the information written in the state shown in FIG. 5A. In a read-out operation RO as shown in FIG. 5B, the information to be read is "1000, . . . , 1011100110;" and an order ROO of the read-out bits is in the direction of the arrow inside FIG. 5B.

In the magnetic memory device that uses the magnetic wire 10 (the magnetic shift register MML), the written information (the magnetization 15m of the magnetic domain 15) is moved along the magnetic wire 10 when writing and reading the information. In other words, the information moves through the magnetic wire 10 when writing. The information also moves when reading. Last in, first out writing and reading is performed; and destructive read-out is performed.

Examples of the operations of the magnetic memory device 110 according to the embodiment will now be described. Namely, the following operations are performed in the magnetic memory device 110 including the first memory unit MAT1, the second memory unit MAT2, and the controller CU. The first memory unit MAT1 includes the first memory array MML_ARRAY-1 and the first drive unit 60-1. The second memory unit MAT2 includes the second memory array MML_ARRAY-2 and the second drive unit 60-2. The following operations are controlled by the controller CU.

Figure 6:
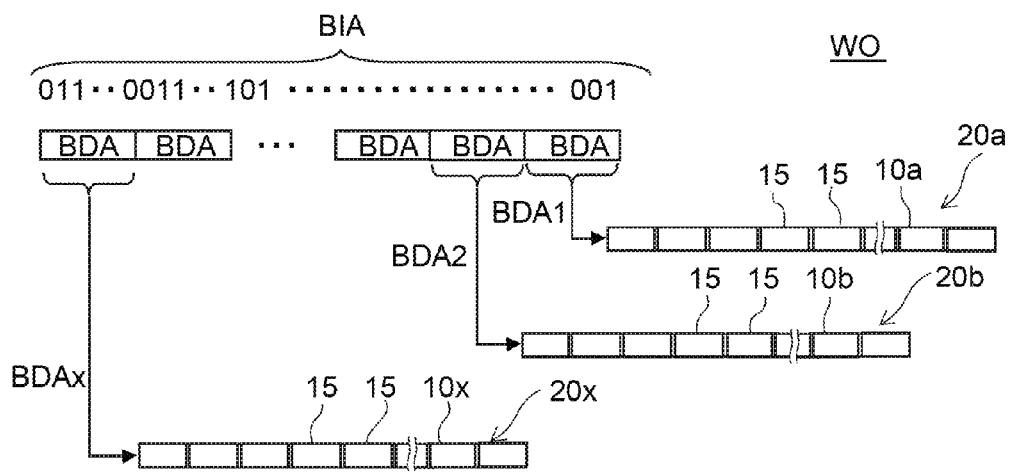
FIG. 6 is a schematic view showing an operation of the magnetic memory device according to the first embodiment.

FIG. 6 is a schematic view illustrating an operation of the magnetic memory device according to the first embodiment.

As shown in FIG. 6, the following writing operation WO is performed in the magnetic memory device 110.

The controller CU subdivides input data BIA into the multiple one-dimensional bit input arrays BDA. For example, the input data is supplied to the input buffer 72. For example, each of the multiple one-dimensional bit input arrays BDA has the same size (length). The multiple one-dimensional bit input arrays BDA include, for example, a first array BDA1, a second array BDA2, etc. The multiple one-dimensional bit input arrays BDA include an xth array BDAx (x being an integer not less than 2).

The controller CU stores the first array BDA1 in the first magnetic shift register unit 20a (the first magnetic wire 10a) of the first memory array MML_ARRAY-1 (the first memory unit MAT1) on a last in, first out basis. The controller CU stores the second array BDA2 in the second magnetic shift register unit 20b (the second magnetic wire 10b) of the second memory array MML_ARRAY-2 (the second memory unit MAT2) on a last in, first out basis. The controller CU stores the xth array BDAx in a xth magnetic shift register unit 20x (an xth magnetic wire 10x) of an xth memory array on a last in, first out basis.

Thus, in the embodiment, the input data BIA is subdivided into the multiple one-dimensional bit input arrays BDA; and the multiple one-dimensional bit input arrays BDA are stored in different magnetic wires 10 (magnetic shift registers MML) of the memory array.

Figure 7:
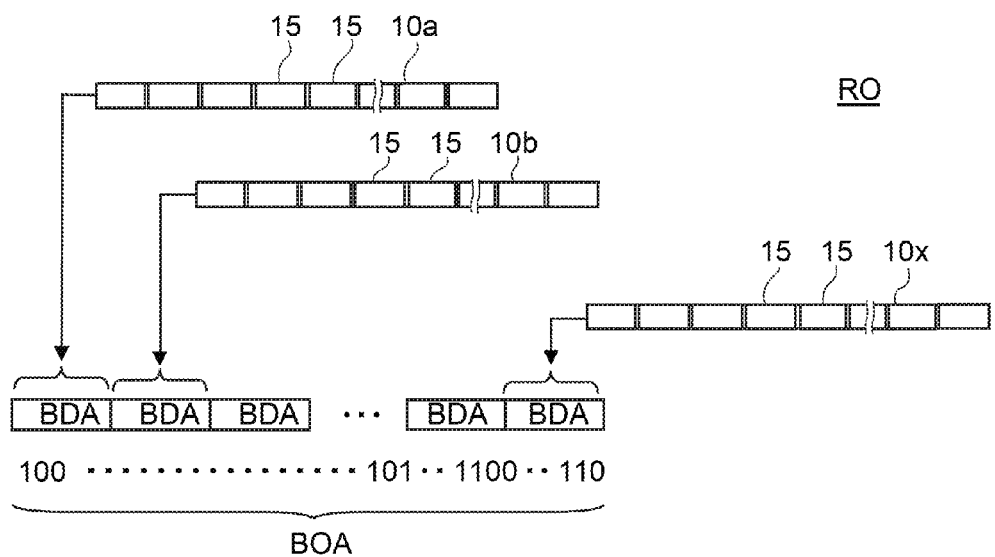
FIG. 7 is a schematic view showing an operation of the magnetic memory device according to the first embodiment.

FIG. 7 is a schematic view illustrating an operation of the magnetic memory device according to the first embodiment.

As shown in FIG. 7, the following read-out operation RO is performed in the magnetic memory device 110.

The controller CU outputs data BOA including a portion obtained by arranging the first array BDA1 stored in the first magnetic shift register unit 20a (the first magnetic wire 10a) and the second array BDA2 stored in the second magnetic shift register unit 20b (the second magnetic wire 10b).

In the case where the controller CU stores the xth array BDAx in the xth magnetic shift register unit 20x (the first magnetic wire 10x) of the xth memory array on a last in, first out basis in the writing operation WO, the controller CU outputs the data BOA including a portion obtained by arranging the xth array BDAx stored in the xth magnetic shift register unit 20x (the xth magnetic wire 10x) in the read-out operation RO.

Thereby, parallel operations of multiple magnetic shift registers are possible; and increased operation speeds are possible.

In other words, the multiple memory arrays 50 are provided in the magnetic memory device 110 according to the embodiment. The memory array 50 includes multiple magnetic shift registers MML. The magnetic shift register MML can store a one-dimensional bit array on a last in, first out (first in, last out) basis. For example, the magnetic shift register MML can store the one-dimensional bit array on a stack basis.

In the magnetic memory device 110, the input data is subdivided into the multiple one-dimensional bit input arrays having the same length when storing input data from the outside in a designated address. The magnetic shift registers MML corresponding to the designated address of the one-dimensional bit input arrays are selected from the multiple memory arrays 50. Then, the subdivided one-dimensional bit input arrays are stored respectively in one magnetic shift register MML of each of the memory arrays 50 in the order designated by the designated address. This operation is performed by the controller CU.

When a command is received from the outside to output the output data stored in the designated address, the following operation is performed. The magnetic shift registers MML that correspond to the designated address are selected respectively from the memory arrays 50. The one-dimensional bit output arrays that are each read from one magnetic shift register MML of each of the memory arrays 50 are arranged in the order designated by the designated address and output to the outside as the output data. This operation is performed by the controller CU.

In the magnetic memory device 110, for example, a variable resistance element such as a MTJ (Magnetic Tunnel Junction) element or the like is used when sensing the information (the directions of the magnetizations 15m of the magnetic domains 15) stored in the magnetic wire 10 (the magnetic shift register unit 20). The signal obtained by such an element is relatively small. A large sense amplifier SA is provided to sense the signal with high sensitivity.

In the embodiment, the surface area of the circuit unit can be small because one preamplifier is provided for multiple magnetic wires 10 instead of providing the preamplifiers respectively for the magnetic wires 10. In other words, the first memory array MML_ARRAY-1 includes the multiple magnetic shift register units (the first magnetic shift register unit 20a, etc.). In such a case, the first drive unit 60-1 includes the first preamplifier PA1 connected to the multiple magnetic shift register units included in the first memory array MML_ARRAY-1. The second memory array MML_ARRAY-2 includes the multiple magnetic shift register units (the second magnetic shift register unit 20b, etc.). The second drive unit 60-2 includes the second preamplifier PA2 connected to the multiple magnetic shift register units included in the second memory array MML_ARRAY-2. For example, one preamplifier (e.g., the first preamplifier PA1, the second preamplifier PA2, or the like) is provided in the memory array 50. Thereby, the surface area of the circuit unit including the preamplifiers can be small. Thereby, the ratio of the memory region in the entire chip can be high.

On the other hand, the operation speed of the preamplifier is limited. Therefore, in a reference example that stores the information (the input data) to be stored in one memory array 50 and reads the information from the one memory array 50, the time necessary for reading the stored information is long.

Conversely, in the embodiment, parallel operations are performed. In other words, the information (the input data) to be stored is subdivided into multiple one-dimensional bit input arrays; and the subdivided one-dimensional bit input arrays are stored in different magnetic wires 10 of the memory array 50. Therefore, the time that is necessary for reading the stored information can be reduced according to the number of subdivisions.

For example, data of the size determined to be the unit of the input and output is subdivided into the one-dimensional bit arrays. The bit length of the one-dimensional bit arrays is not more than the bit length of the magnetic shift register MML. In the writing operation WO, the subdivided one-dimensional bit arrays are written to the magnetic shift registers MML selected respectively from the multiple memory arrays 50. In the read-out operation RO, the one-dimensional bit arrays are read respectively from the magnetic shift registers MML selected from the memory arrays 50, are arranged in the prescribed order, and are used as the output data.

Thus, parallel operations are performed in the embodiment. A high input/output speed is obtained by performing parallel operations of the magnetic shift registers MML. By providing one preamplifier for multiple magnetic shift registers MML, the surface area occupied by the circuit unit inside the chip can be small. Operations that accommodate the operation speed of the preamplifier and the transfer speed based on the delay due to the interconnect resistance and the like are obtained; and store/reproduction operations having high reliability can be realized.

According to the embodiment, a practical magnetic memory device can be provided.

For example, in NAND flash memory, the input data can be stored collectively in locations that are physically proximal.

Conversely, in the memory device that uses the magnetic wires 10, it is effective to retain the data in dispersed form. In the memory device that uses the magnetic wires, the EBR is increased by performing the shift operation. Therefore, it is favorable to perform the input and output collectively.

In the embodiment, a practical magnetic storage operation is possible.

According to investigations of the inventor, it was found that the information may degrade when the information is moved through the magnetic wire 10. In other words, it was found that the direction of the magnetization 15m may become unstable when the magnetization 15m moves through the magnetic wire 10. A special operation that suppresses the degradation of the information is desirable.

Figure 8A:
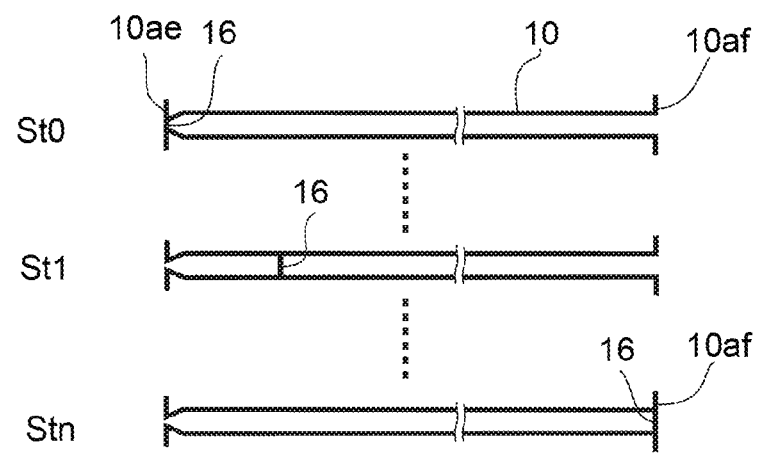
FIG. 8A and FIG. 8B are schematic views showing a characteristic of the magnetic memory device.
Figure 8B:
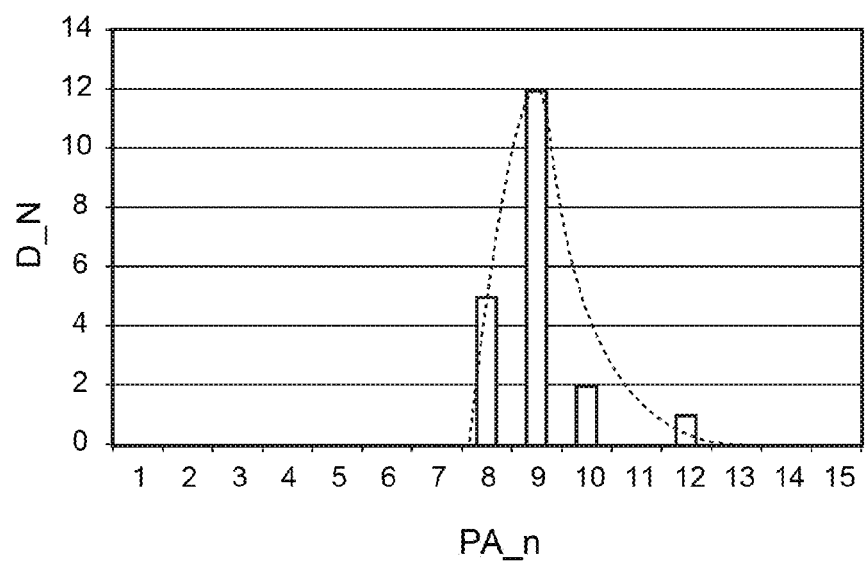

FIG. 8A and FIG. 8B are schematic views illustrating a characteristic of the magnetic memory device.

FIG. 8A is a schematic view showing an experiment performed by the inventor. FIG. 8B is a graph of the experimental results.

In the magnetic wire 10 for the experiment as shown in FIG. 8A, the width of the first end portion 10ae is narrower than the width of the first other portions of the magnetic wire 10. The domain wall 16 is formed at the first end portion 10ae. The domain wall 16 is moved from the first end portion 10ae toward the first other end portion 10af by applying a current pulse to the magnetic wire 10. The domain wall that reaches the first other end portion 10af is sensed electrically. The sensing may be performed optically. By setting the width of the first end portion 10ae to be narrower than the width of the other portions, the domain wall 16 can be formed stably at the position of the first end portion 10ae.

In an initial state St0, the domain wall 16 is positioned at the one end portion 10ae. When one current pulse is supplied (a first post-pulse application state St1), the domain wall 16 moves from the one end portion 10ae toward the first other end portion 10af. When n current pulses have been supplied (an nth post-pulse application state Stn), the domain wall 16 reaches the first other end portion 10af; and the arrival of the domain wall 16 is sensed. Such movement of the domain wall 16 (from the initial state St0 to the nth post-pulse application state Stn) is performed multiple times (e.g., twenty times). The number of current pulses supplied until the domain wall 16 reaches the first other end portion 10af is determined.

FIG. 8B is an example of the experimental results. In the example, the movement of the domain wall 16 is performed twenty times. In FIG. 8B, the horizontal axis is a number PA_n of current pulses supplied until the domain wall 16 reaches the first other end portion 10af. The vertical axis is a number D_N of occurrences.

As shown in FIG. 8B, in five cases, the domain wall 16 reached the first other end portion 10af by supplying eight current pulses. In twelve cases, the domain wall 16 reached the first other end portion 10af by supplying nine current pulses. In two cases, the domain wall 16 reached the first other end portion 10af by supplying ten current pulses. In one case, the domain wall 16 reached the first other end portion 10af by supplying twelve current pulses. Thus, there is fluctuation in the distance the domain wall 16 moves by supplying the current pulse. In other words, there is fluctuation in the movement speed of the domain wall 16. Such fluctuation causes misoperations in the magnetic memory. As illustrated by the dotted line of FIG. 8B, it was found that the number D_N of occurrences has, for example, a characteristic having a Weibull distribution.

Figure 9:
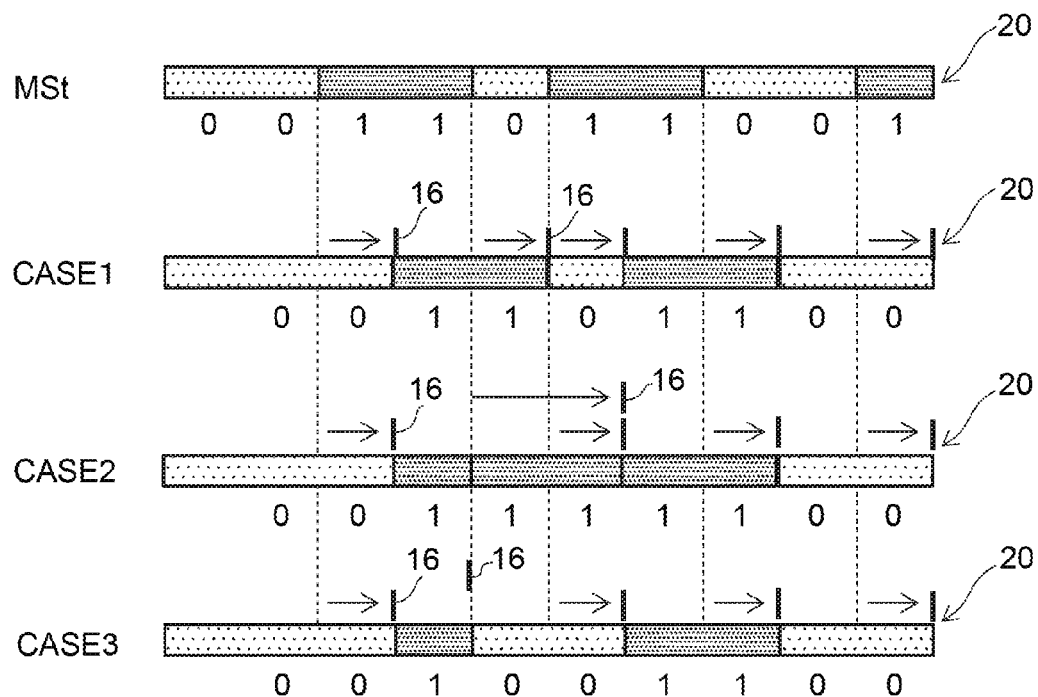
FIG. 9 is a schematic view showing an operation of the magnetic memory device.

FIG. 9 is a schematic view illustrating an operation of the magnetic memory device.

FIG. 9 illustrates the movement of the memory state (the movement of the domain wall 16) of the magnetic shift register unit 20 (the magnetic wire 10).

In FIG. 9, the prescribed information "0011011001" is stored in an initial memory state MSt. FIG. 9 illustrates three states after the information is shifted by applying a current pulse for one bit shift. A first post-movement state CASE 1 corresponds to the correct shift operation. In this case, all of the domain walls 16 move at the same speed. In this case, the information of the initial memory state MSt is maintained.

On the other hand, a second post-movement state CASE 2 is an example of a misoperation. In this case, the second domain wall 16 moves at a speed that is faster than that of the other domain walls. The speed is twice the speed of the other domain walls. The third domain wall 16 is overtaken by the domain wall 16 behind it; and one portion of the information changes. In other words, the information of the initial memory state MSt is not maintained; and the information changes.

A third post-movement state CASE 3 also is an example of a misoperation. In this case, the movement speed of the second domain wall 16 is slow. In the example, the second domain wall 16 is drawn as not having moved. In this case as well, the information of the initial memory state MSt is not maintained; and the information changes.

Thus, misoperations occur in the magnetic memory when there is fluctuation in the movement speed of the domain wall 16. The misoperations become pronounced as the number of shifts of the information increases. In other words, even in the case where reading and writing are not performed and only the shift operation is performed, the information degrades as the number of shift operations increases.

The embodiment focuses on a new problem of suppressing the degradation of the information due to the shift operation. The degradation of the information is a problem unique to the magnetic shift register.

The first memory unit MAT1 and the second memory unit MAT2 are provided in the magnetic memory device 110 according to the embodiment. The input data BIA is subdivided into the multiple one-dimensional bit input arrays BDA. The multiple one-dimensional bit input arrays BDA include the first array BDA1 and the second array BDA2. In the embodiment, the first array BDA1 is stored in the first magnetic shift register unit 20a (the first magnetic wire 10a) (of the first memory unit MAT1) on a last in, first out basis; and the second array BDA2 is stored in the second magnetic shift register unit 20b (the second magnetic wire 10b) of the second memory unit MAT2 on a last in, first out basis. Thereby, the number of data (information) movements can be low. Thereby, store/reproduction operations having high reliability can be realized.

Figure 10:
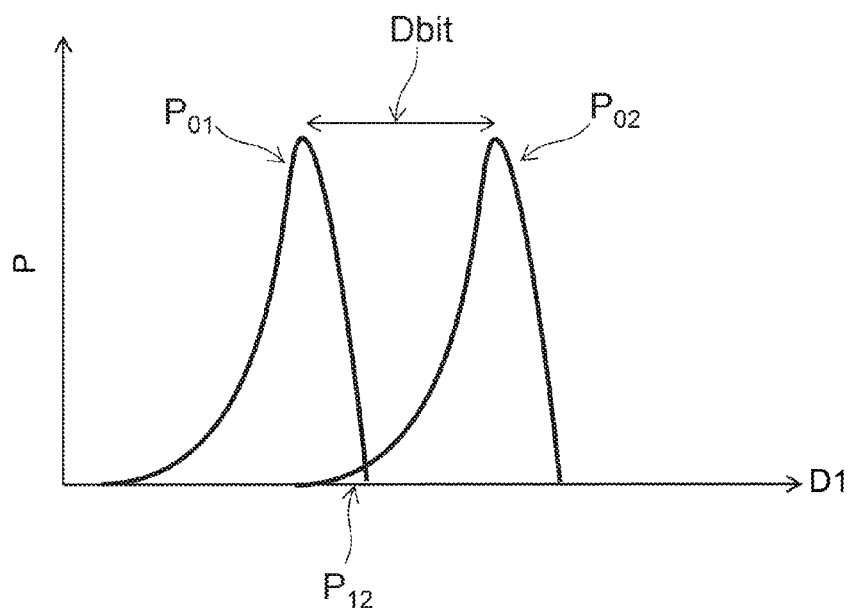
FIG. 10 is a schematic view illustrating a characteristic of the magnetic memory device.

FIG. 10 is a schematic view illustrating a characteristic of the magnetic memory device.

FIG. 10 shows an example of the existence probability of the domain wall 16 of the magnetic wire 10. In FIG. 10, the horizontal axis is the extension direction (the first direction D1) of the magnetic wire 10 (the first magnetic wire 10a). The horizontal axis corresponds to a position along the first direction D1 of the domain wall 16. The vertical axis is an existence probability P of the domain wall 16.

FIG. 10 shows the distribution of the existence probability P for two domain walls 16. The position along the first direction D1 of a first domain wall existence probability distribution $P_{01}$ is different from the position along the first direction D1 of a second domain wall existence probability distribution $P_{02}$. A distance Dbit (a distance along the first direction D1) for expressing one bit is not less than the distance between these existence probability distributions. If the distance Dbit is set to be shorter than the distance between these existence probability distributions, errors occur easily in the information.

For example, the first domain wall existence probability distribution $P_{01}$ and the second domain wall existence probability distribution $P_{02}$ may overlap. In other words, a probability $P_{12}$ is the probability of the first domain wall existence probability distribution $P_{01}$ and the second domain wall existence probability distribution $P_{02}$ overlapping due to multiple movement of the domain walls 16. Errors occur in the information if the probability $P_{12}$ of the overlap is high. It is favorable for the probability $P_{12}$ of the overlap to be low.

In the embodiment, the probability $P_{12}$ of the overlap occurring between the first domain wall existence probability distribution $P_{01}$ and the second domain wall existence probability distribution $P_{02}$ (referring to FIG. 10) is, for example, $10^{-4}$ or less. For example, bit error correction technology is applied in the embodiment. The bit error correction technology is practically effective when the bit error rate is $10^{-4}$ or less. In such a case, for example, the probability $P_{12}$ of the overlap recited above is set to be $10^{-4}$ or less. Thereby, the errors of the information can be suppressed practically.

Figures 11A, 11B:
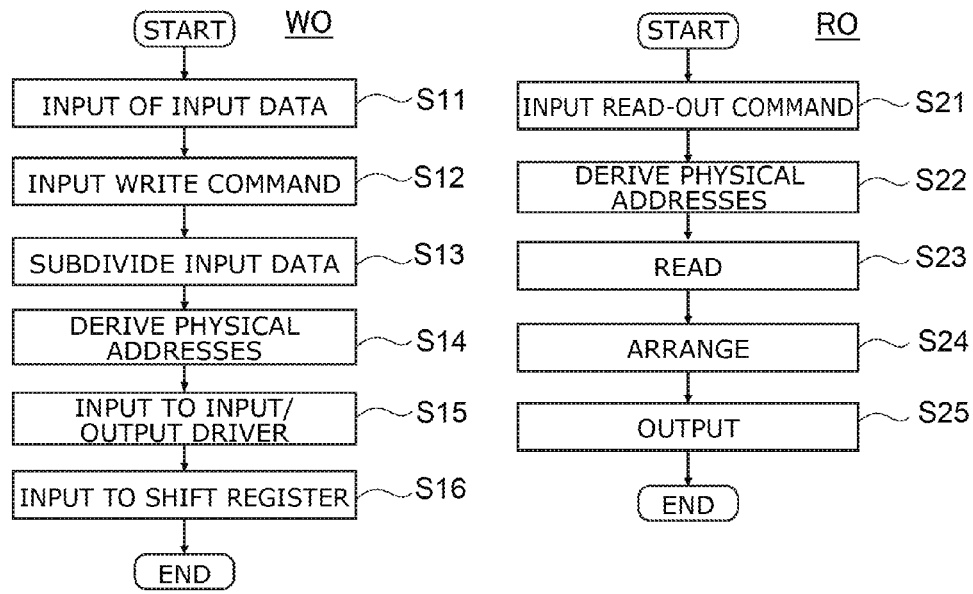
FIG. 11A and FIG. 11B are flowcharts showing operations of the magnetic memory device according to the first embodiment.

FIG. 11A and FIG. 11B are flowcharts illustrating operations of the magnetic memory device according to the first embodiment.

In the writing operation WO as shown in FIG. 11A, an input data bit column is input to the input buffer 72 (step S11).

The write designated logical address and the write command (the input/output command I/O_C) are input to the controller CU (step S12).

The input data bit column is subdivided into multiple one-dimensional bit arrays (step S13). Each of the multiple one-dimensional bit arrays has a determined length.

The physical addresses of the corresponding magnetic shift registers MML are derived from the logical address that is input according to the content of the lookup table 74 (the reference table) (step S14). The physical addresses are allotted to the magnetic shift registers MML where the one-dimensional bit arrays are to be written.

The one-dimensional bit arrays are input to the input/output drivers (the read/write drivers RW-D) of the memory arrays 50 having the magnetic shift registers MML corresponding to the physical addresses designated as recited above (step S15).

Using the input/output drivers, the one-dimensional bit arrays that are the input are input to the designated magnetic shift registers MML (step S16).

In the read-out operation RO as shown in FIG. 11B, the read designated logical address and the read-out command (the input/output command I/O_C) are input to the controller CU (step S21).

The physical addresses that are allotted to the magnetic shift registers MML where the one-dimensional bit arrays are retained are derived from the logical address that is input according to the content of the lookup table 74 (the reference table) (step S22).

Using the input/output drivers, the one-dimensional bit arrays are read from the designated magnetic shift registers MML and retained in the input/output drivers (step S23).

The one-dimensional arrays that are read are arranged inside the output buffer 73 in the order determined by the information retained in the reference table (step S24).

The arranged array is output to the outside from the output buffer 73 (step S25).

Figure 12:
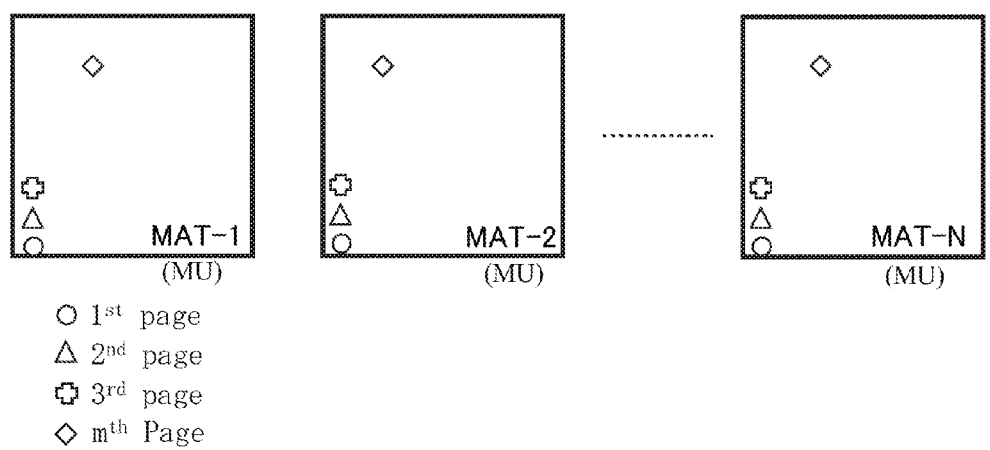
FIG. 12 is a schematic view showing an operation of the magnetic memory device according to the first embodiment.

FIG. 12 is a schematic view illustrating an operation of the magnetic memory device according to the first embodiment.

The first to Nth memory units MAT1 to MATN are provided. For example, the multiple one-dimensional bit input arrays that correspond to a first page are stored respectively in the magnetic shift registers MML of the first to Nth memory units MAT1 to MATN. The multiple one-dimensional bit input arrays that correspond to a second page are stored respectively in other magnetic shift registers MML of the first to Nth memory units MAT1 to MATN. The multiple one-dimensional bit input arrays that correspond to a third page are stored respectively in other magnetic shift registers MML of the first to Nth memory units MAT1 to MATN. The multiple one-dimensional bit input arrays that correspond to a fourth page are stored respectively in other magnetic shift registers MML of the first to Nth memory units MAT1 to MATN. For example, the number of memory units MU (i.e., N) is 128; and the subdivided number (the number of multiple one-dimensional bit arrays) is 128.

Figure 13A:
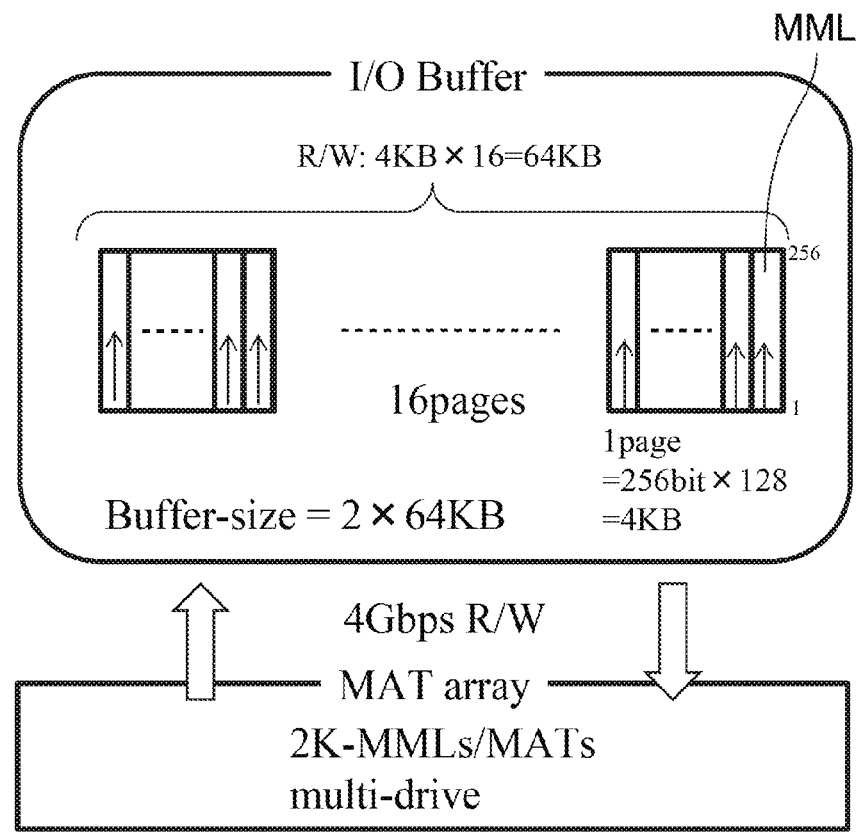
FIG. 13A and FIG. 13B are schematic views showing an operation of the magnetic memory device according to the first embodiment.
Figure 13B:
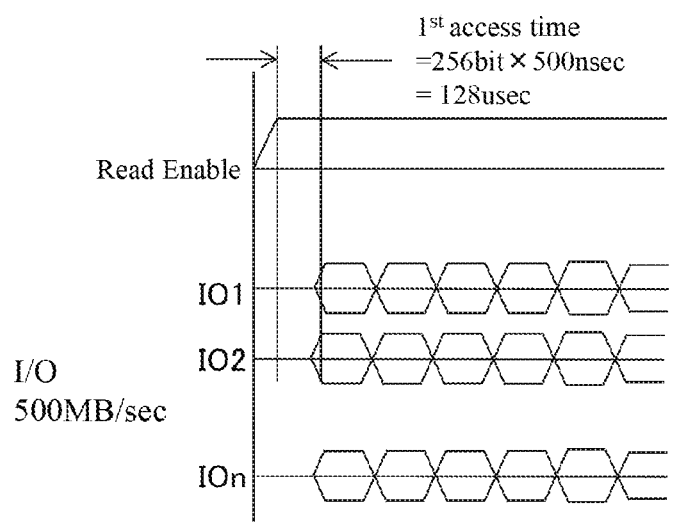

FIG. 13A and FIG. 13B are schematic views illustrating an operation of the magnetic memory device according to the first embodiment.

As shown in FIG. 13A, for example, the size of one magnetic shift register MML (the size) is set to 256 bits. The number of magnetic shift registers MML corresponding to one page is set to 128. In such a case, the page size is 4 KB. The number of pages is set to 16. The data of one magnetic shift register MML is read continuously. For example, the size of the read/write (the multiple reads/writes) in the I/O buffer is 4 KB×16 (=64 KB). The size of the buffer is 128 KB (i.e., 2×64 KB). For example, the read/write speed is set to 4 Gbps.

As shown in FIG. 13B, the access time is 256 bits×500 ns (nanoseconds), i.e., 128 μs (microseconds). Thus, the access time can be shortened.

Second Embodiment

In the embodiment, the writing operation and the read-out operation are different from those of the first embodiment. The configuration of the first embodiment described in regard to FIG. 1 to FIG. 4A and FIG. 4B is applicable to the magnetic memory device according to the embodiment.

Figure 14:
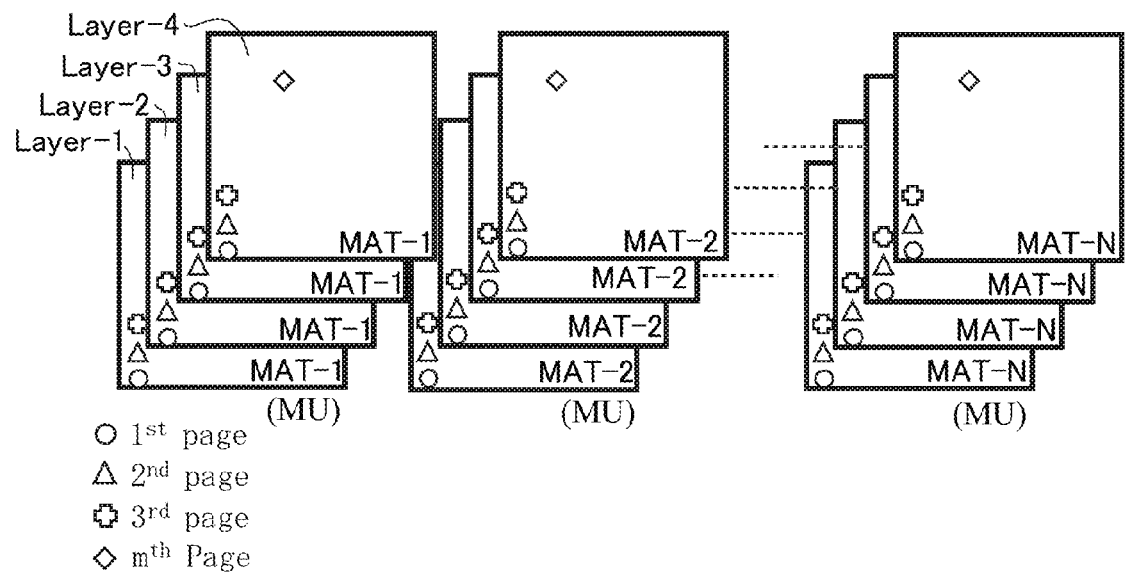
FIG. 14 is a schematic view showing an operation of the magnetic memory device according to the third embodiment.

FIG. 14 is a schematic view illustrating an operation of the magnetic memory device according to the third embodiment.

In the embodiment as shown in FIG. 14, the data of one page is stored by being dispersed into the multiple memory units MU (the first to Nth memory units MAT1 to MATN). In the example of the drawing, the dispersed number is, for example, 4. The number of memory units MU (i.e., N) is 128; and the subdivided number (the number of multiple one-dimensional bit arrays) is 512.

For example, the input data is subdivided into the multiple one-dimensional bit input arrays. The subdivided number of the embodiment is more than the subdivided number of the first embodiment. For example, the subdivided number of the embodiment is 4 times the subdivided number of the first embodiment.

A first portion of the multiple one-dimensional bit input arrays corresponding to the first page is stored in a first portion (a first layer Layer-1) of the magnetic shift registers MML of the first to Nth memory units MAT1 to MATN. A second portion of the multiple one-dimensional bit input arrays corresponding to the second page is stored in a second portion (a second layer Layer-2) of the magnetic shift registers MML of the first to Nth memory units MAT1 to MATN. A third portion of the multiple one-dimensional bit input arrays corresponding to the third page is stored in a third portion (a third layer Layer-3) of the magnetic shift registers MML of the first to Nth memory units MAT1 to MATN. A fourth portion of the multiple one-dimensional bit input arrays corresponding to the fourth page is stored in a fourth portion (a fourth layer Layer-4) of the magnetic shift registers MML of the first to Nth memory units MAT1 to MATN.

Figure 15A:
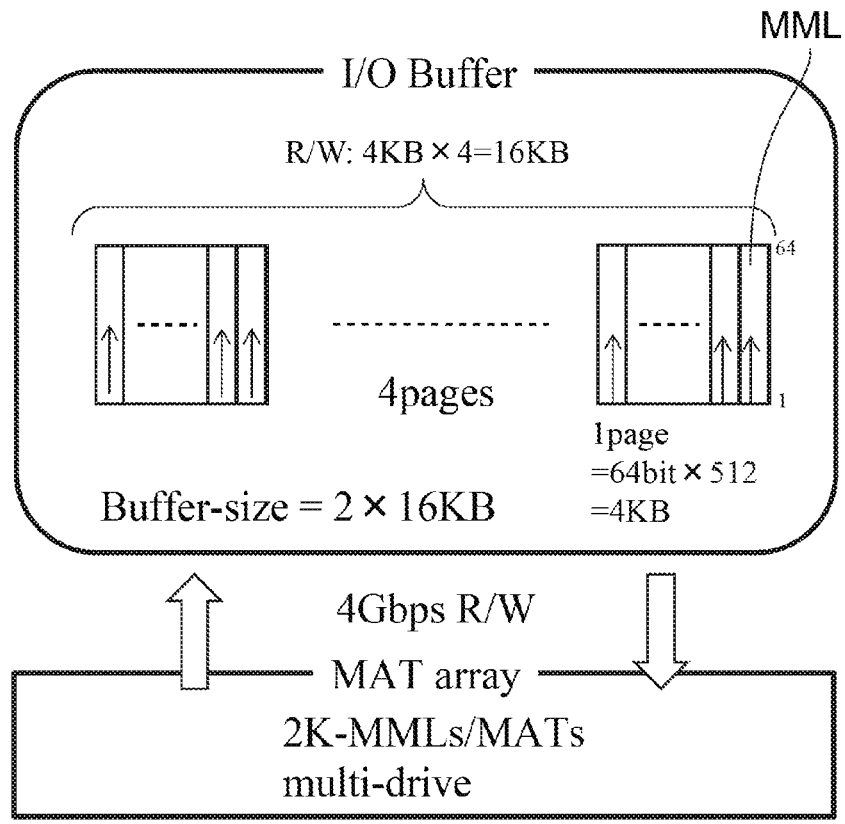
FIG. 15A and FIG. 15B are schematic views showing an operation of the magnetic memory device according to the second embodiment.
Figure 15B:
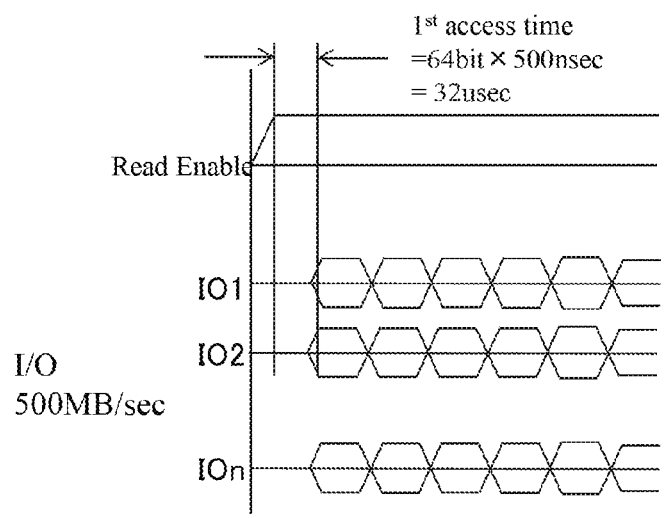

FIG. 15A and FIG. 15B are schematic views illustrating an operation of the magnetic memory device according to the second embodiment.

As shown in FIG. 15A, for example, the size of one portion of one magnetic shift register MML is set to 64 bits. In other words, one input/output of the data from one magnetic shift register MML is set to 64 bits. The number of magnetic shift registers MML corresponding to one page is set to 512. In such a case, the page size is 4 KB. The number of pages is set to 4. The data of one magnetic shift register MML is read continuously. For example, the size of the read/write (the multiple reads/writes) in the I/O buffer is 4 KB×4 (=16 KB). The size of the buffer is 32 KB (i.e., 2×16 KB). For example, the read/write speed is set to 4 Gbps.

As shown in FIG. 15B, the access time is 64 bits×500 ns, i.e., 32 µs. Thus, in the embodiment, the access time can be shortened further.

Figure 16:
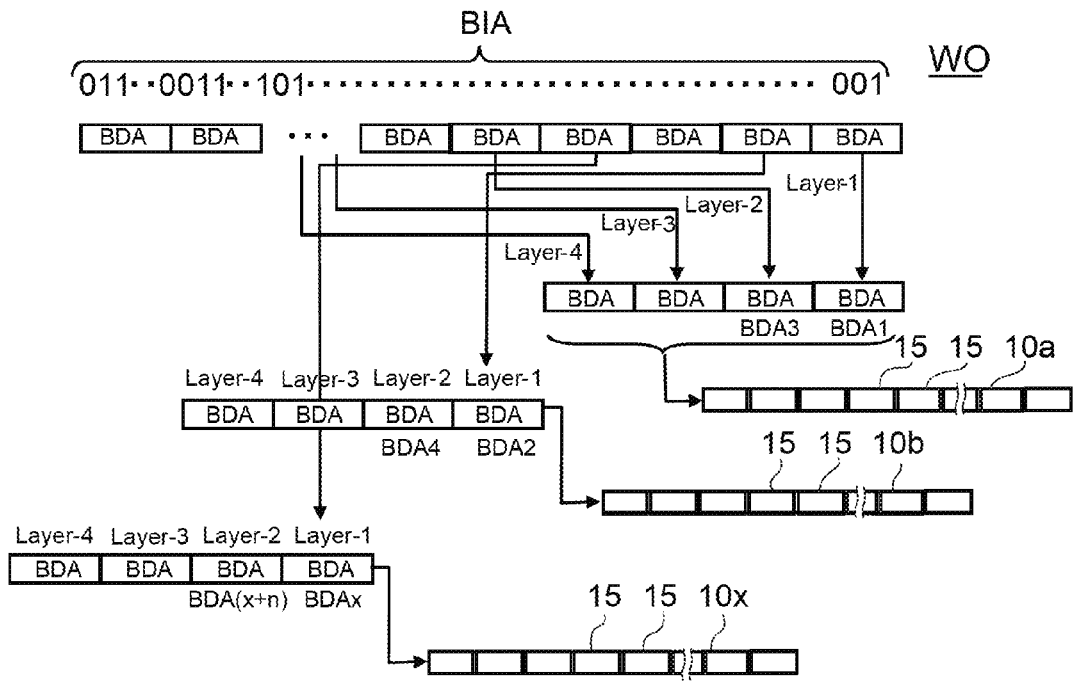
FIG. 16 is a schematic view showing an operation of the magnetic memory device according to the second embodiment.

FIG. 16 is a schematic view illustrating an operation of the magnetic memory device according to the second embodiment.

In the magnetic memory device according to the embodiment as shown in FIG. 16, the following writing operation WO is performed.

The controller CU subdivides the input data BIA into the multiple one-dimensional bit input arrays BDA. For example, each of the multiple one-dimensional bit input arrays BDA has the same size (length). For example, in addition to the first array BDA1 and the second array BDA2, the multiple one-dimensional bit input arrays BDA include a third array BDA3, a fourth array BDA4, etc. The multiple one-dimensional bit input arrays BDA include the xth array BDAx and the (x+n)th array BDA (x+n) (x being an integer not less than 2, and n being an integer not less than 1).

For example, the first array BDA1 corresponds to the first layer Layer-1. The second array BDA2 corresponds to the first layer Layer-1. The third array BDA3 corresponds to the second layer Layer-2. The fourth array BDA4 corresponds to the second layer Layer-2.

The controller CU stores the first array BDA1 in one portion (the first layer Layer-1) of the first magnetic shift register unit 20a (the first magnetic wire 10a) of the first memory array MML_ARRAY-1 (the first memory unit MAT1) on a last in, first out basis. Then, the controller CU stores the second array BDA2 in one portion (the first layer Layer-1) of the second magnetic shift register unit 20b (the second magnetic wire 10b) of the second memory array MML_ARRAY-2 (the second memory unit MAT2) on a last in, first out basis. The controller CU stores the third array BDA3 in one other portion (the second layer Layer-2) of the first magnetic shift register unit 20a (the first magnetic wire 10a) on a last in, first out basis. The controller CU stores the fourth array BDA4 in one other portion (the second layer Layer-2) of the second magnetic shift register unit 20b (the second magnetic wire 10b) on a last in, first out basis.

The controller CU stores the xth array BDAx in one portion of the xth magnetic shift register unit 20x (the xth magnetic wire 10x) of the xth memory array on a last in, first out basis. The controller CU stores the (x+n)th array BDA (x+n) in one other portion of the xth magnetic shift register unit 20x (the xth magnetic wire 10x) of the xth memory array on a last in, first out basis. For example, n is 1.

Figure 17:
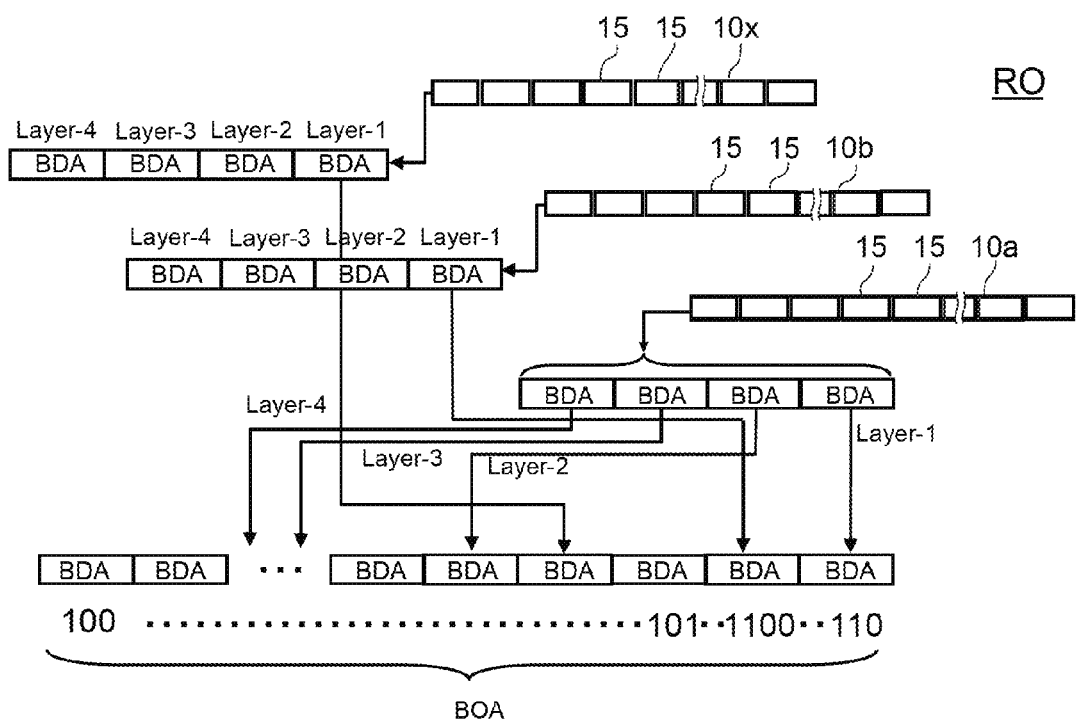
FIG. 17 is a schematic view showing an operation of the magnetic memory device according to the first embodiment.

FIG. 17 is a schematic view illustrating an operation of the magnetic memory device according to the first embodiment.

In the magnetic memory device according to the embodiment as shown in FIG. 17, the following read-out operation RO is performed.

The controller CU outputs the data BOA including a portion obtained by arranging the first array BDA1 stored in the one portion of the first magnetic shift register unit 20a (the first magnetic wire 10a) recited above, the second array BDA2 stored in the one portion of the second magnetic shift register unit 20b (the second magnetic wire 10b) recited above, the third array BDA3 stored in the one other portion of the first magnetic shift register unit 20a recited above, and the fourth array BDA4 stored in the one other portion of the second magnetic shift register unit 20b recited above.

In the case where the controller CU stores the xth array BDAx in one portion of the xth magnetic shift register unit 20x (the first magnetic wire 10x) of the xth memory array on a last in, first out basis and stores the (x+n)th array BDA (x+n) in one other portion of the xth magnetic shift register unit 20x (the xth magnetic wire 10x) of the xth memory array on a last in, first out basis in the writing operation WO, the controller CU outputs the data BOA including a portion obtained by arranging the xth array BDAx stored in the one portion of the xth magnetic shift register unit 20x (the xth magnetic wire 10x) recited above and the (x+n)th array BDA (x+n) stored in the one other portion of the xth magnetic shift register unit 20x (the xth magnetic wire 10x) recited above in the read-out operation RO.

Figures 18A, 18B:
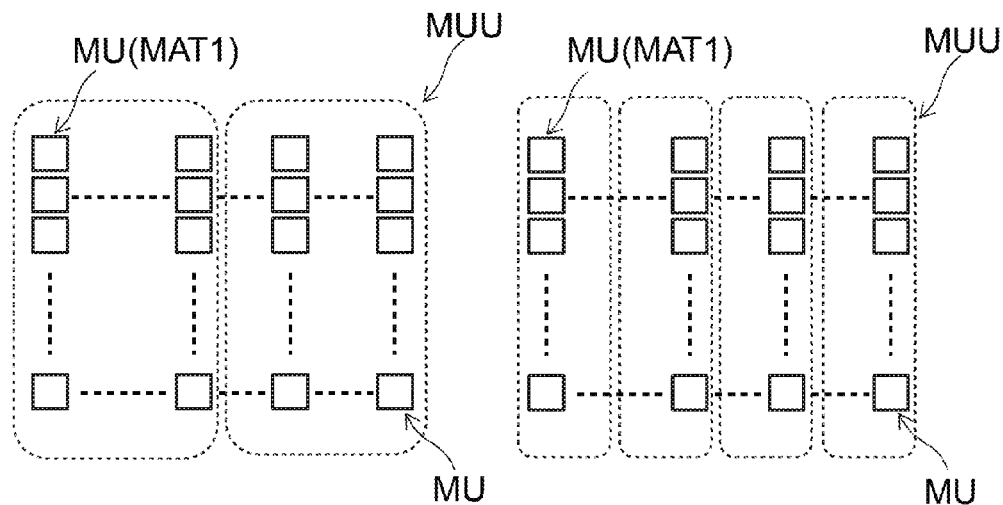
FIG. 18A and FIG. 18B are schematic views showing the magnetic memory device according to the embodiment.

FIG. 18A and FIG. 18B are schematic views illustrating the magnetic memory device according to the embodiment.

As shown in FIG. 18A, one memory region unit MUU is subdivided into two groups (banks). Each of the two banks includes multiple memory units MU. For example, the example corresponds to an example in which one preamplifier is provided for one memory unit MU (e.g., the first memory unit MAT1). The read-out operation is performed for one bank. At this time, writing is performed for the other bank.

As shown in FIG. 18B, one memory region unit MUU is subdivided into four groups (banks). Each of the four banks includes multiple memory units MU. For example, the example corresponds to an example in which two preamplifiers are provided for one memory unit MU (e.g., the first memory unit MAT1). The read-out operation is performed for one bank. At this time, writing is performed for one of the three other banks.

For example, in the case where the number of banks is high, the memory space can be shared efficiently. The surface area of the preamplifiers is relatively large. Therefore, practically, the number of preamplifiers is limited.

Figure 19:
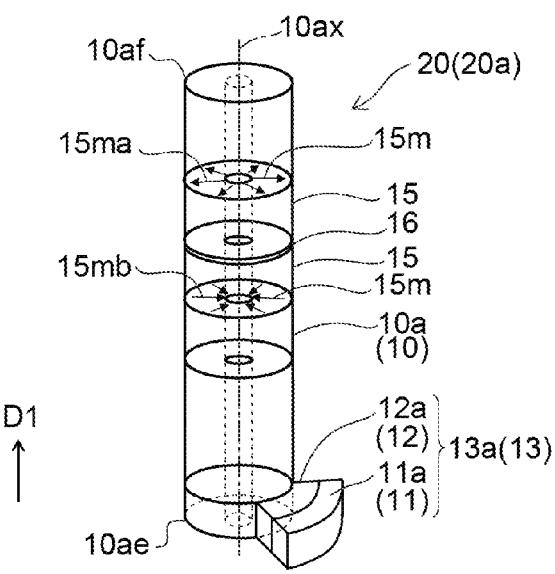
FIG. 19 is a schematic perspective view showing one portion of the magnetic memory device according to the embodiment.

FIG. 19 is a schematic perspective view illustrating one portion of the magnetic memory device according to the embodiment.

FIG. 19 illustrates the magnetic shift register unit 20 (the first magnetic shift register unit 20a).

At least one portion of the magnetic wire 10 (the first magnetic wire 10a) extends in the first direction D1 having a first axis 10ax as an axis. The first direction D1 is, for example, the Z-axis direction. In the first state, the magnetizations 15m of the magnetic domains 15 included in the at least one portion of the magnetic wire 10 (the first magnetic wire 10a) recited above are in the first magnetization direction 15ma. In the second state, the magnetizations 15m of the magnetic domains 15 included in the at least one portion of the magnetic wire 10 (the first magnetic wire 10a) recited above are in the second magnetization direction 15mb.

The first magnetization direction 15ma intersects the first direction D1. The first magnetization direction 15ma is the direction from the first axis 10ax toward a position separated from the first axis 10ax. The second magnetization direction 15mb intersects the first direction D1. The second magnetization direction 15mb is a direction toward the first axis 10ax from a position separated from the first axis 10ax.

The input/output unit 13 (the first input/output unit 13a) is provided at the vicinity of the first end portion 10ae of the magnetic layer 11 (the first magnetic layer 11a). The intermediate layer 12 (the first intermediate layer 12a) is provided between the magnetic layer 11 (the first magnetic layer 11a) and the first end portion 10ae of the magnetic wire 10 (the first magnetic wire 10a). In the example, the magnetic layer 11 and the intermediate layer 12 have concentric configurations around the first axis 10ax.

Figure 20:
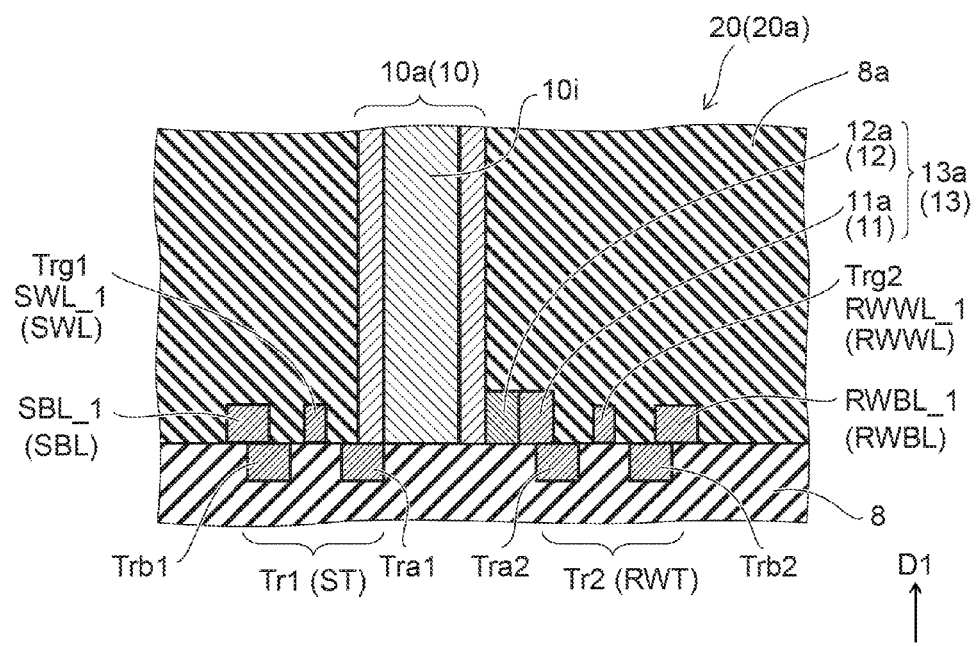
FIG. 20 is a schematic cross-sectional view showing one portion of the magnetic memory device according to the embodiment.

FIG. 20 is a schematic cross-sectional view illustrating one portion of the magnetic memory device according to the embodiment.

For example, the first transistor Tr1 is provided in one portion of a substrate 8. The second transistor Tr2 is provided in one other portion of the substrate 8. The substrate 8 includes, for example, a semiconductor substrate such as a silicon substrate, etc.

The magnetic wire 10 (the first magnetic wire 10a) is provided on the first terminal Tra1 of the first transistor Tr1. In the example, the magnetic wire 10 extends along a direction (the first direction D1) perpendicular to the upper surface of the substrate 8. The second terminal Trb1 of the first transistor Tr1 is connected to an interconnect SBL (an interconnect SBL_1). The first gate Trg1 of the first transistor Tr1 is connected to an interconnect SWL (an interconnect SWL_1).

The magnetic layer 11 (the first magnetic layer 11a) is provided on the third terminal Tra2 of the second transistor Tr2. The fourth terminal Trb2 of the second transistor Tr2 is connected to an interconnect RWBL (an interconnect RWBL_1). The second gate Trg2 of the second transistor Tr2 is connected to an interconnect RWWL (an interconnect RWWL_1).

An insulating layer 8a is provided around the magnetic wire 10 and the interconnects recited above. The magnetic wire 10 has a tubular configuration. An axial unit 10i is provided inside the magnetic wire 10.

The magnetic layer 11 (the first magnetic layer 11a, etc.) and the magnetic wire 10 (the first magnetic wire 10a, etc.) include, for example, a ferromagnet, a ferrimagnet, or an artificial lattice.

The ferromagnet includes, for example, an alloy including at least one element selected from iron (Fe), cobalt (Co), nickel (Ni), manganese (Mn), and chrome (Cr) and at least one element selected from platinum (Pt), palladium (Pd), iridium (Ir), ruthenium (Ru), and rhodium (Rh). For example, CoPt, NiFe, CoCrPt, or the like is used as the ferromagnet. For example, the characteristics of the ferromagnet can be adjusted by the conditions of the heat treatment, etc., and by adjusting the composition, etc.

For example, an amorphous alloy (e.g., TbFeCo, GdFeCo, or the like) including a rare earth and transition metal is used as the ferrimagnet. In the case where the amorphous alloy is used, it is easy for the magnetization to be perpendicular to the film surface. For example, the amorphous alloy is formed by sputtering.

A stacked body of Co/Pt, a stacked body of Co/Pd, a stacked body of Co/Ni, or the like is used as the artificial lattice. By using these stacked bodies, it is easy for the magnetization to be perpendicular to the film surface. For example, these stacked structures have the <0001> orientation of a hexagonal close-packed structure. For example, these stacked structures have the <111> orientation of a face-centered cubic structure.

The thickness (the length in a direction perpendicular to the first direction D1) of the magnetic layer 11 is, for example, not less than 5 nanometers (nm) and not more than 50 nm.

It is favorable for the damping coefficient of the magnetic layer 11 to be larger than the damping coefficient of the magnetic shift register units 20.

There is a possibility that the orientation of the magnetization of the magnetic layer 11 may undesirably change due to the reaction of the spin torque produced by the magnetic shift register unit 20 when the current is caused to flow. For example, the change of the orientation of the magnetization can be suppressed by setting the damping coefficient of the magnetic layer 11 to be larger than the damping coefficient of the magnetic shift register unit 20.

In such a case, the time necessary for reversing the magnetization of the magnetic layer 11 due to the spin torque lengthens. By shortening the time that the current is caused to flow, the magnetization of the magnetic layer 11 does not reverse easily.

By arranging the intermediate layer 12 between the magnetic layer 11 and the magnetic wire 10, the orientation of the magnetization 15m of the magnetic wire 10 can be independent from the orientation of the magnetization of the magnetic layer 11. The intermediate layer 12 includes, for example, at least one selected from the group consisting of Ta, Ru, Pt, Pd, Ir, Cu, Au, Ag, Cr, and Al. An alloy including two or more selected from the group may be used as the intermediate layer 12. An alloy including at least one selected from the group and another element may be used as the intermediate layer 12. The intermediate layer 12 may include a stacked film of one layer selected from the group and one other layer selected from the group. A nonmagnetic insulator such as magnesium oxide (MgO), aluminum oxide ($Al_2O_3$), silicon oxide ($SiO_2$), etc., may be used as the intermediate layer 12. The thickness (the length in a direction perpendicular to the first direction D1) of the intermediate layer 12 is, for example, not less than 1.5 nm and not more than 20 nm.

The thickness (the length in a direction perpendicular to the first direction D1) of the magnetic wire 10 is, for example, not less than 0.5 nm and not more than 10 nm. Thereby, for example, uniform conducting characteristics and uniform magnetic properties are obtained easily. The length (the length along the first direction D1) of the magnetic wire 10 is, for example, not less than 20 nm and not more than 20 micrometers (μm). Because the length of the magnetic wire 10 is 20 nm or more, the domain wall 16 is obtained stably. For example, because the length of the magnetic wire 10 is 20 μm or less, the effects of the voltage drop are suppressed easily.

Third Embodiment

The embodiment relates to a magnetic storage method.

In the magnetic storage method according to the embodiment, the input data BIA is subdivided into the multiple one-dimensional bit input arrays BDA including the first array BDA1 and the second array BDA2. For example, step S13 described in regard to FIG. 11A is implemented.

Then, the first array BDA1 is stored in the first magnetic shift register unit 20a on a last in, first out basis; and the second array BDA2 is stored in the second magnetic shift register unit 20b on a last in, first out basis. For example, at least one portion of steps S14 to S16 described in regard to FIG. 11A is implemented.

The first magnetic shift register unit 20a is included in the first memory array MML_ARRAY-1. The second magnetic shift register unit 20b is included in the second memory array MML_ARRAY-2. The first memory array MML_ARRAY-1 is included in the first memory unit MAT1 including the first drive unit 60-1. The second memory array MML_ARRAY-2 is included in the second memory unit MAT2 including the second drive unit 60-2.

According to the magnetic storage method according to the embodiment, a practical magnetic storage method can be provided. In other words, a high input/output speed is obtained by performing parallel operations of the magnetic shift registers MML. The occupied surface area of the circuit unit inside the chip can be small by providing one preamplifier for multiple magnetic shift registers MML. Operations that accommodate the operation speed of the preamplifier and the transfer speed based on the delay due to the interconnect resistance and the like are obtained; and store/reproduction operations having high reliability can be realized. The number of data (information) movements can be reduced; and store/reproduction operations having high reliability can be realized.

In the embodiment, for example, the multiple one-dimensional bit input arrays BDA have the same size (or length).

In the magnetic storage method according to the embodiment, for example, data that includes a portion obtained by arranging the first array BDA1 stored in the first magnetic shift register unit 20a and the second array BDA2 stored in the second magnetic shift register unit 20b is output.

For example, the subdivided multiple one-dimensional bit input arrays BDA may further include the third array BDA3 and the fourth array BDA4. In such a case, the following may be implemented. The first array BDA1 is stored in one portion of the first magnetic shift register unit 20a on a last in, first out basis. The second array BDA2 is stored in one portion of the second magnetic shift register unit 20b on a last in, first out basis. The third array BDA3 is stored in one other portion of the first magnetic shift register unit 20a on a last in, first out basis. The fourth array BDA4 is stored in one other portion of the second magnetic shift register unit 20b on a last in, first out basis.

In the embodiment, the following may be implemented. Data including a portion obtained by arranging the first array BDA1 stored in the one portion of the first magnetic shift register unit 20a, the second array BDA2 stored in the one portion of the second magnetic shift register unit 20b, the third array BDA3 stored in the one other portion of the first magnetic shift register unit 20a, and the fourth array BDA4 stored in the one other portion of the second magnetic shift register unit 20b is output.

According to the embodiments, a practical magnetic memory device and magnetic storage method can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as memory units, memory arrays, drive units, magnetic shift register units, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices, and magnetic storage methods practicable by an appropriate design modification by one skilled in the art based on the magnetic memory devices, and the magnetic storage methods described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a first memory unit including a first memory array and a first drive unit;
   a second memory unit including a second memory array and a second drive unit; and
   a controller,
   the first memory array including a first magnetic shift register unit,
   the second memory array including a second magnetic shift register unit,
   the controller subdividing input data into a plurality of one-dimensional bit input arrays,
   the one-dimensional bit input arrays including a first array and a second array,
   the controller storing the first array in the first magnetic shift register unit on a last in, first out basis, and storing the second array in the second magnetic shift register unit on a last in, first out basis,
   wherein
   the one-dimensional bit input arrays further includes a third array and a fourth array, the controller stores the first array in one portion of the first magnetic shift register unit on a last in, first out basis, the controller stores the second array in one portion of the second magnetic shift register unit on a last in, first out basis, the controller stores the third array in one other portion of the first magnetic shift register unit on a last in, first out basis, and the controller stores the fourth array in one other portion of the second magnetic shift register unit on a last in, first out basis.

2. The device according to claim 1, wherein each of the one-dimensional bit input arrays has a same size.

3. The device according to claim 1, wherein the controller outputs data including a portion obtained by arranging the first array stored in the first magnetic shift register unit and the second array stored in the second magnetic shift register unit.

4. The device according to claim 1, wherein the controller outputs data including a portion obtained by arranging the first array stored in the one portion of the first magnetic shift register unit, the second array stored in the one portion of the second magnetic shift register unit, the third array stored in the one other portion of the first magnetic shift register unit, and the fourth array stored in the one other portion of the second magnetic shift register unit.

5. The device according to claim 1, wherein
the first magnetic shift register unit includes:
 a first transistor including a first terminal, a second terminal, and a first gate;
 a second transistor including a third terminal, a fourth terminal, and a second gate;
 a magnetic wire including a plurality of magnetic domains, a first end portion of the magnetic wire being connected to the first terminal;
 a magnetic layer electrically connected to the third terminal; and
 an intermediate layer provided between the magnetic wire and the magnetic layer, and
the first drive unit includes:
 a shift driver electrically connected to the second terminal;
 a shift selector electrically connected to the first gate;
 a read/write driver electrically connected to the fourth terminal;
 a read/write selector electrically connected to the second gate; and
 a magnetic wire driver connected to a first other end portion of the magnetic wire.

6. The device according to claim 5, wherein the intermediate layer is provided between the first end portion and the magnetic layer.

7. The device according to claim 5, wherein
at least one portion of the magnetic wire extends in a first direction,
a magnetization of the magnetic domain included in the at least one portion of the magnetic wire is in a first magnetization direction in a first state, the first magnetization direction intersecting the first direction, and
the magnetization of the magnetic domain included in the at least one portion of the magnetic wire is in a second magnetization direction in a second state, the second magnetization direction intersecting the first direction and being reverse of the first magnetization direction.

8. The device according to claim 5, wherein
the at least one portion of the magnetic wire extends in a first direction having a first axis as an axis,
a magnetization of the magnetic domain included in the at least one portion of the magnetic wire is in a first magnetization direction in a first state,
the magnetization of the magnetic domain included in the at least one portion of the magnetic wire is in a second magnetization direction in a second state,
the first magnetization direction intersects the first direction,
the first magnetization direction is a direction from the first axis toward a position separated from the first axis,
the second magnetization direction intersects the first direction, and
the second magnetization direction is a direction toward the first axis from a position separated from the first axis.

9. The device according to claim 1, wherein
the first memory array includes a plurality of magnetic shift register units,
the first drive unit includes a first preamplifier connected to the magnetic shift register units included in the first memory array,
the second memory array includes a plurality of magnetic shift register units, and
the second drive unit includes a second preamplifier connected to the magnetic shift register units included in the second memory array.

10. A magnetic storage method, comprising:
subdividing input data into a plurality of one-dimensional bit input arrays including a first array and a second array; and
storing the first array in a first magnetic shift register unit on a last in, first out basis, and storing the second array in a second magnetic shift register unit on a last in, first out basis,
the first magnetic shift register unit being included in a first memory array,
the second magnetic shift register unit being included in a second memory array,
the first memory array being included in a first memory unit, the first memory unit including a first drive unit,
the second memory array being included in a second memory unit, the second memory unit including a second drive unit,
wherein
 the one-dimensional bit input arrays further include a third array and a fourth array, and
the method includes:
 storing the first array in one portion of the first magnetic shift register unit on a last in, first out basis;
 storing the second array in one portion of the second magnetic shift register unit on a last in, first out basis;
 storing the third array in one other portion of the first magnetic shift register unit on a last in, first out basis; and
 storing the fourth array in one other portion of the second magnetic shift register unit on a last in, first out basis.

11. The method according to claim 10, wherein each of the one-dimensional bit input arrays has a same size.

12. The method according to claim 10, including outputting data including a portion obtained by arranging the first array stored in the first magnetic shift register unit and the second array stored in the second magnetic shift register unit.

13. The method according to claim 12, including outputting data including a portion obtained by arranging the first array stored in the one portion of the first magnetic shift register unit, the second array stored in the one portion of the second magnetic shift register unit, the third array stored in the one other portion of the first magnetic shift register unit, and the fourth array stored in the one other portion of the second magnetic shift register unit.

14. A magnetic storage method, comprising:
    subdividing input data into a plurality of one-dimensional bit input arrays, the plurality of one-dimensional bit input arrays including a first array, a second array, a third array, and a fourth array; and
    storing the first array in one portion of a first magnetic shift register unit on a last in, first out basis, storing the second array in one portion of a second magnetic shift register unit on a last in, first out basis, storing the third array in one other portion of the first magnetic shift register unit on a last in, first out basis, and storing the fourth array in one other portion of the second magnetic shift register unit on a last in, first out basis,
    the first magnetic shift register unit being included in a first memory array,
    the second magnetic shift register unit being included in a second memory array,
    the first memory array being included in a first memory unit, the first memory unit including a first drive unit,
    the second memory array being included in a second memory unit, the second memory unit including a second drive unit; and
    further comprising outputting data including a portion obtained by arranging the first array stored in the one portion of the first magnetic shift register unit, the second array stored in the one portion of the second magnetic shift register unit, the third array stored in the one other portion of the first magnetic shift register unit, and the fourth array stored in the one other portion of the second magnetic shift register unit.

* * * * *